United States Patent
Hasegawa et al.

[19]

[11] Patent Number: 5,883,701
[45] Date of Patent: Mar. 16, 1999

[54] SCANNING PROJECTION EXPOSURE METHOD AND APPARATUS

[75] Inventors: Noriyasu Hasegawa; Kunitaka Ozawa, both of Utsunomiya; Hiroshi Kurosawa, Matsudo; Keiji Yoshimura, Utsunomiya, all of Japan

[73] Assignee: Canon Kabushiki Kaisha, Tokyo, Japan

[21] Appl. No.: 717,349

[22] Filed: Sep. 20, 1996

[30] Foreign Application Priority Data

| Sep. 21, 1995 | [JP] | Japan | 7-266111 |
| Jan. 4, 1996 | [JP] | Japan | 8-014778 |
| Jan. 4, 1996 | [JP] | Japan | 8-014779 |

[51] Int. Cl.$^6$ .......................... G03B 27/42; G01B 11/00
[52] U.S. Cl. ..................... 355/53; 355/67; 356/399; 356/400; 356/401
[58] Field of Search .................... 356/399, 400, 356/401; 355/53, 67

[56] References Cited

U.S. PATENT DOCUMENTS

| 4,676,630 | 6/1987 | Matsushita et al. | 355/53 |
| 4,748,477 | 5/1988 | Isohata et al. | 355/53 |
| 4,749,867 | 6/1988 | Matsushita et al. | 250/442.1 |
| 4,998,134 | 3/1991 | Isohata et al. | 355/53 |
| 5,142,156 | 8/1992 | Ozawa et al. | 250/548 |
| 5,182,615 | 1/1993 | Kurosawa et al. | 356/400 |
| 5,491,534 | 6/1996 | Shiozawa | 355/69 |
| 5,608,492 | 3/1997 | Sato | 355/68 |
| 5,659,383 | 8/1997 | Ozawa | 355/53 |

*Primary Examiner*—Richard Moses
*Assistant Examiner*—Shival Virmani
*Attorney, Agent, or Firm*—Fitzpatrick, Cella, Harper & Scinto

[57] ABSTRACT

A scanning projection exposure apparatus includes an illumination optical system for illuminating an original with pulse light, a projection optical system for projecting a pattern of the original, illuminated with the pulse light, onto a substrate, a moving device for moving the original and the substrate relative to each other, a position measuring device for measuring a relative positional relation between the original and the substrate, and a controller for discriminating whether the positional relation measured by the position measuring device is in a predetermined range. The discrimination is performed within a period after the moving device initiates the relative movement of the original and the substrate and before the illumination optical system initiates the projection exposure with the pulse light. The controller stops the projection exposure with the pulse light from the illumination optical system when the positional relation is discriminated as being out of a predetermined range.

70 Claims, 17 Drawing Sheets

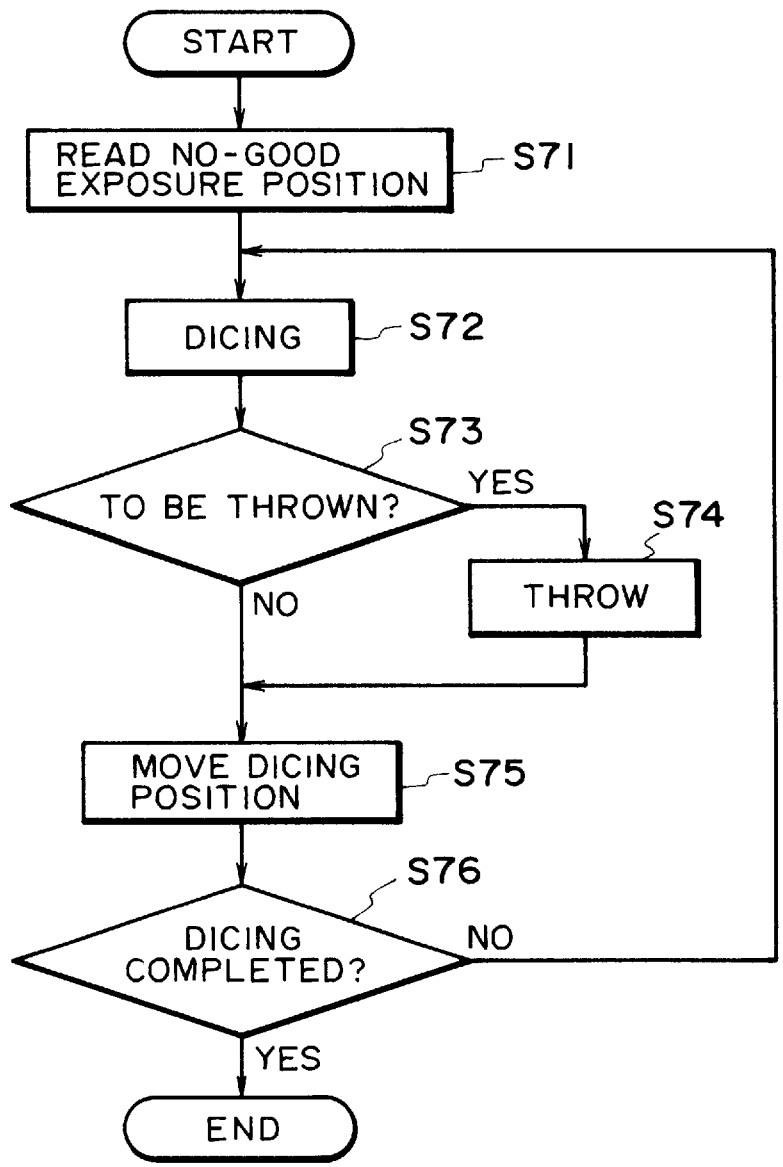
F I G. 14

SCANNING PROJECTION EXPOSURE METHOD AND APPARATUS

FIELD OF THE INVENTION AND RELATED ART

This invention relates to a scanning projection exposure method and apparatus, for use in manufacture of semiconductor devices, for example.

In scanning exposure apparatuses, there is a necessity of performing inspection with regard to two items before starting the exposure process. That is, in the exposure procedure of a scanning exposure apparatus, a reticle stage and a wafer stage are accelerated and decelerated in a timed relation such as depicted in FIG. 1, (a) and (b), and the exposure is performed while keeping a constant speed. Here, there is a positional deviation between the reticle stage and the wafer stage. As illustrated in FIG. 2, such positional deviation applies a largest effect on the exposure, in the portion in which the constant speed is going to be reached from the acceleration period before the exposure. This necessitates, at the first, measurement and evaluation of the positional deviation between the wafer and the reticle.

Also, replacement of a wafer or a reticle or any unevenness of wafer thickness may cause a change in the distance between the wafer and the reticle, which leads to a focus error. Usually, correction with respect to a direction of level (height) is executed. The amount of correction in the level direction will be largest in a case just after completion of wafer replacement or step motion and before start of scan exposure. Thus, as a second, there is a necessity of measuring the wafer-to-reticle distance and evaluating the focus error.

It is accordingly an object of the present invention to provide a scanning exposure method and apparatus with use of a light source comprising an excimer laser control, for example, wherein the exposure process is prevented when there is a positional deviation between an original and a substrate with respect to a scan direction or a non-scan direction and/or a variation of the distance between the original and the substrate, which may cause exposure non-uniformness or a focus error.

On the other hand, in a semiconductor chip production process using a semiconductor exposure apparatus having a pulse light source for exposure of a circuit pattern of a semiconductor chip, an inspecting operation the same as that for good chips is performed to those chips having been printed with a process having a critical fault. Semiconductor chip inspection is repeated plural times, and it needs time and cost. Performing the inspection operation to non-good chips as well as to good chips, thus results in lower production efficiency and higher production cost.

It is accordingly a second object of the present invention to provide an exposure apparatus which enables higher efficiency and lower cost production of semiconductor chips.

SUMMARY OF THE INVENTION

In accordance with an aspect of the present invention, there is provided a scanning projection exposure apparatus, comprising: illumination means for illuminating an original with pulse light; a projection optical system for projecting a pattern of the original on to a substrate; moving means for relatively moving the original and the substrate; position measuring means for measuring a relative position of the original and the substrate; and control means for causing illuminating the original with pulse light from said illumination means while relatively moving the original and the substrate through said moving means so that the pattern of the original is projected and printed on the substrate through said projection optical system, wherein said control means is also serviceable to (i) measure the relative position of the original and the substrate with use of said position measuring means before the projection exposure with pulse light, (ii) to discriminate whether the measured relative position is within a predetermined range, and (iii) to stop the projection exposure with pulse light when the measured relative position is out of the predetermined range.

In accordance with another aspect of the present invention, there is provided a scanning projection exposure apparatus, comprising: illumination means for illuminating an original with pulse light; a projection optical system for projecting a pattern of the original on to a substrate; moving means for relatively moving the original and the substrate; detecting means for detecting a state of exposure with emission of pulse light; and control means for causing illuminating the original with pulse light from said illumination means while relatively moving the original and the substrate through said moving means so that the pattern of the original is projected and printed on the substrate through said projection optical system; wherein said control means is also serviceable to discriminate whether there is a non-good exposure region on the substrate, on the basis of the detection by said detecting means.

In accordance with a further aspect of the present invention, there is provided a scanning projection exposure apparatus, comprising: illumination means for illuminating an original with pulse light; a projection optical system for projecting a pattern of the original on to a substrate; moving means for relatively moving the original and the substrate; detecting means for detecting a state of exposure preceding to emission of pulse light; and control means for causing illuminating the original with pulse light from said illumination means while relatively moving the original and the substrate through said moving means so that the pattern of the original is projected and printed on the substrate through said projection optical system, wherein said control means is also serviceable to discriminate whether a non-good exposure region is to be produced on the substrate, on the basis of the detection by said detecting means.

In accordance with a yet further aspect of the present invention, there is provided a scanning projection exposure method, comprising the steps of: illuminating an original with pulse light while relatively moving the original and a substrate so that a pattern of the original is projected on to the substrate; measuring a relative position of the original and the substrate; discriminating, on the basis of said measurement, whether the measured relative position is within a predetermined range; and stopping the projection exposure with pulse light when the measured relative position is out of the predetermined range.

In accordance with a still further aspect of the present invention, there is provided a scanning projection exposure method, comprising the steps of: illuminating an original with pulse light while relatively moving the original and a substrate so that a pattern of the original is projected onto the substrate; detecting a state of exposure with emission of pulse light; and discriminating, on the basis of said detection, whether there is a non-good exposure region on the substrate.

In accordance with a still further aspect of the present invention, there is provided a scanning projection exposure method, comprising the steps of: illuminating an original with pulse light while relatively moving the original and a substrate so that a pattern of the original is projected onto the substrate; detecting a state of exposure preceding to emission of pulse light; and discriminating, on the basis of said detection, whether a non-good exposure region is to be produced on the substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 14 is a flow chart for explaining a procedure from completion of semiconductor chip exposure to dicing operation.

DESCRIPTION OF THE PREFERRED EMBODIMENTS

[Embodiment 1]

Figure 3:
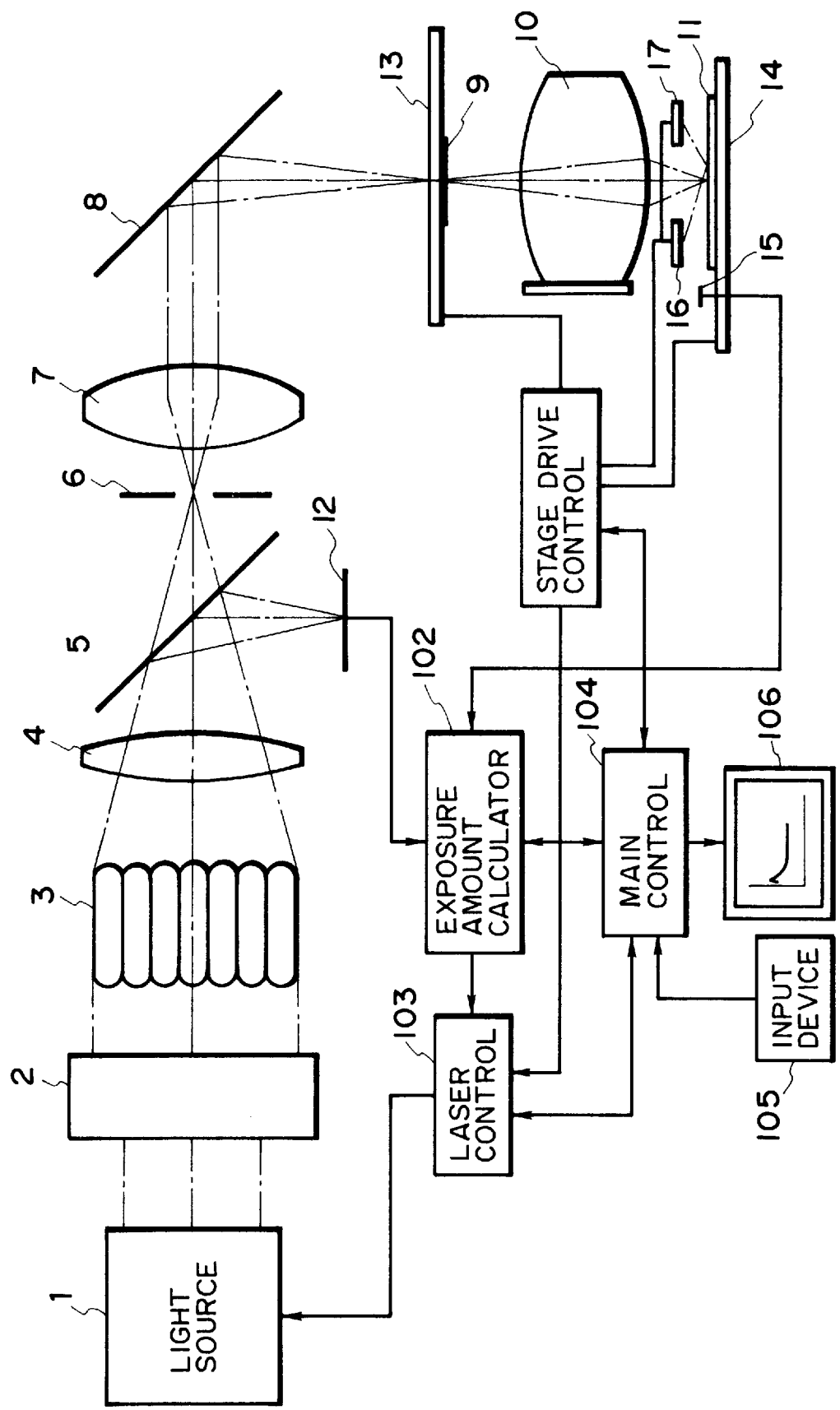
FIG. 3 is a schematic and diagrammatic view of a scanning exposure apparatus according to an embodiment of the present invention.

FIG. 3 is a schematic and diagrammatic view of a scanning exposure apparatus according to a first embodiment of the present invention. This apparatus may be used for manufacture of semiconductor devices such as ICs or LSIs, for example, liquid crystal devices, image pickup devices such as CCDs, or magnetic heads, for example. In the drawing, light from a light source 1 comprising an excimer laser, for example, for providing pulse light, is shaped by a beam shaping optical system 2 into a desired shape, and it is then directed to a light entrance surface of an optical integrator 3 which comprises a fly's eye lens, for example. The fly's eye lens comprises a combination of small lenses, and it defines secondary light sources in the vicinity of a light exit surface thereof. Denoted at 4 is a condenser lens which serves to perform Koehler illumination of a masking blade 6 with light from the secondary light sources of the optical integrator 3. The masking blade 6 and a reticle 9 are disposed in an optically conjugate relation with each other with respect to an imaging lens 7 and a mirror 8. Thus, the shape of an opening of the masking blade 6 determines the shape and size of an illumination region upon the reticle 9. The illumination region on the reticle 9 has an oblong slit shape with its lengthwise direction extending perpendicularly to a scan direction of the reticle 9. Denoted at 10 is a projection optical system for projecting a circuit pattern, formed on the reticle 9, on to a wafer 11 in a reduced scale.

Figure 4:
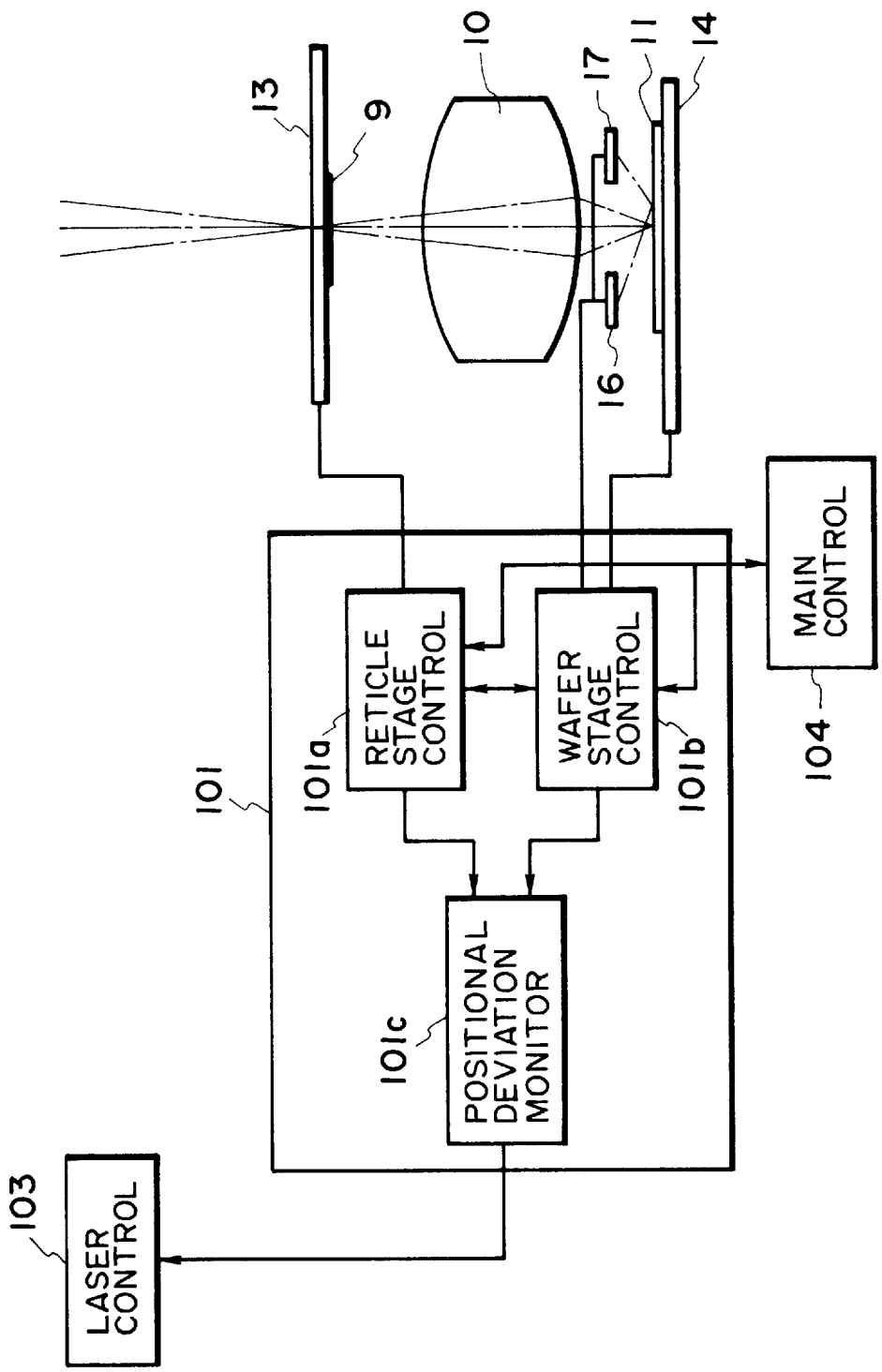
FIG. 4 is a schematic and diagrammatic view of a stage drive control system of the embodiment of FIG. 3.

Denoted at 101 is a stage drive control system which includes, as shown in FIG. 4, a reticle stage control system 101a and a wafer stage control system 101b for moving a reticle stage 13 and a wafer stage 14 at a ratio the same as the magnification of the projection optical system 10 and exactly at constant speeds. On the basis of positional information related to the wafer 11 and the reticle 9 in the scan direction and a non-scan direction, supplied from these control systems, and by using a positional deviation monitor 101c, any positional deviation between these stages is detected. Also, on the basis of the positional deviation between the wafer and the reticle as well as of the distance therebetween, the laser device 1 can be controlled. The wafer stage control system 101b also serves to measure the wafer-to-reticle distance through an AF unit (16 and 17) and, based on this, to adjust and maintain the wafer-to-reticle distance constant.

Denoted at 12 is an exposure amount detector which serves to monitor a portion of pulse light as divided by a half mirror 5. Denoted at 15 is another exposure amount detector by which the exposure amount via the optical system 10 can be monitored.

Laser control system 103 produces a trigger signal and a charging voltage signal corresponding to a desired exposure amount, to control the pulse energy and light emission interval (spacing) of the laser device 1. Production of such trigger signal and charging voltage signal is based on parameters such as an illuminance monitored signal from an exposure amount calculator 102, a stage current position signal from the stage drive control system 101 and hysteresis information from a main control system 104, for example.

Desired exposure amount is inputted through an input device 105, and the result obtained through the exposure amount detector 12 or 15 can be displayed at a display device 106.

Figure 5:
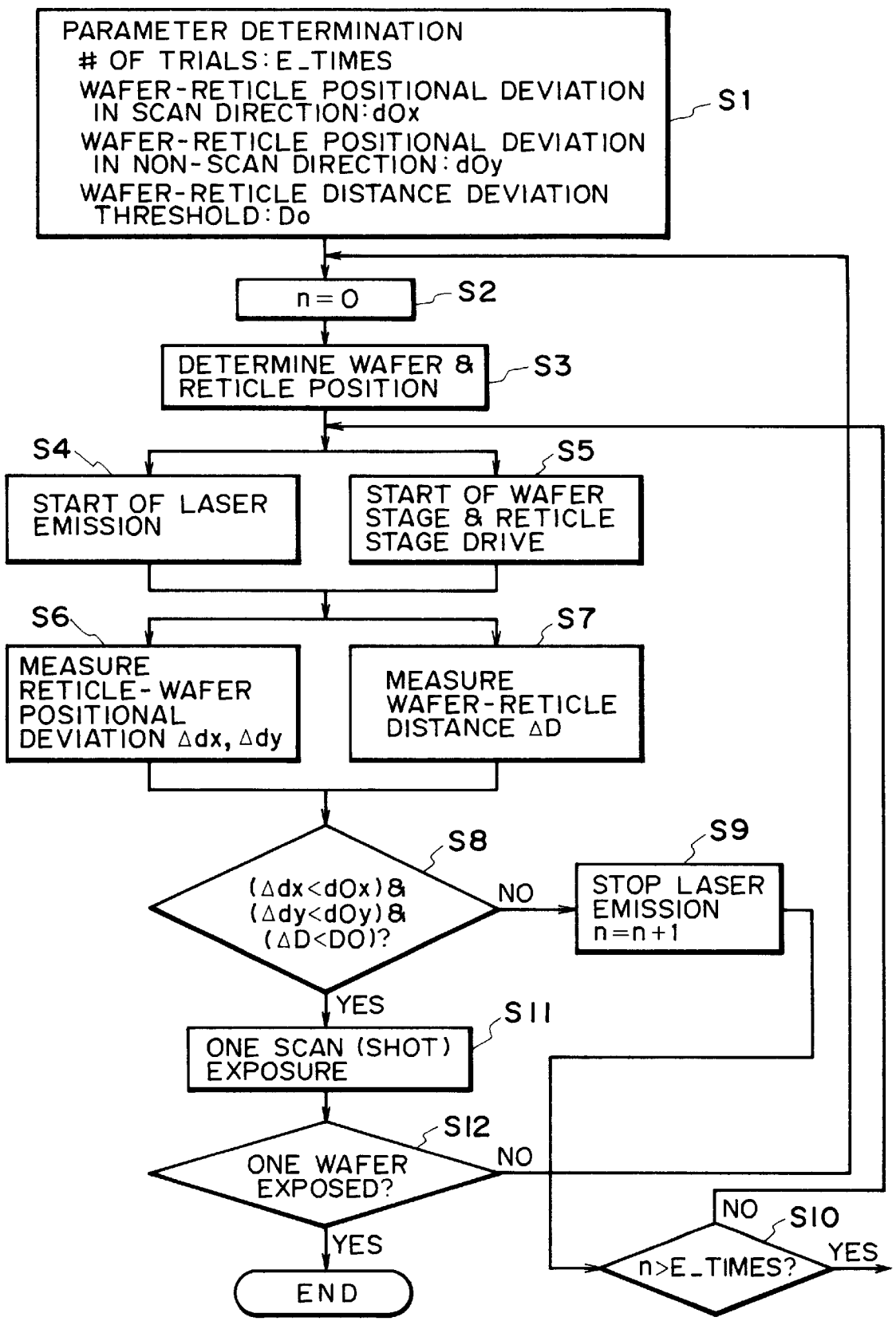
FIG. 5 is a flow chart for explaining an exposure control method in the embodiment of FIG. 3.

FIG. 5 is a flow chart for explaining exposure procedure in the apparatus of FIG. 3. First, at step S1, an operator uses the input device 105 to specify a threshold d0x for wafer-to-reticle positional deviation in scan direction, a threshold d0y for positional deviation in non-scan direction, a threshold D0 for deviation in wafer-to-reticle distance, and a number of trials ($E_{13}$TIMES) for resumption of exposure in a case the thresholds are exceeded. Alternatively, data having been specified by the operator beforehand and stored into a storage device such as a hard disk, a floppy disk or a memory, may be automatically read out.

Figure 6:
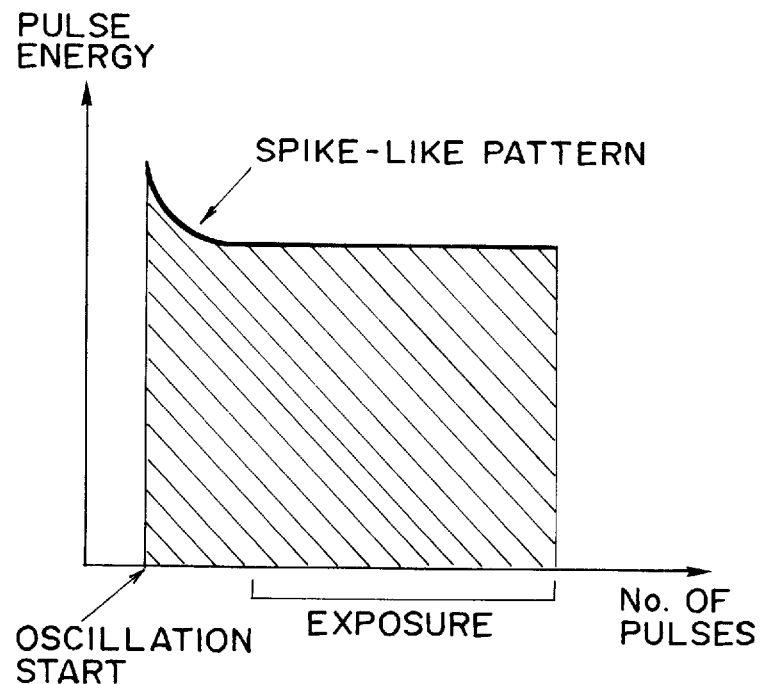
FIG. 6 is a schematic view for explaining pulse energy characteristic of an excimer laser.

At step S2, the number of trials is set to zero. Then, at step S3, exposure start positions for the reticle and the wafer as well as stage drive start positions, for start of exposure, are determined. Subsequently, at steps S4 and S5, drive of the wafer stage and the reticle stage is initiated and, in synchronism with this, laser oscillation for removing laser spike such as illustrated in FIG. 6 is initiated. In order that stable emission pulse can be used for the exposure, synchronization is taken with respect to drive of the stages. At step S4, the laser light is blocked by means of a shutter inside the laser light source device or of the masking blade, to prevent illumination of the reticle. Laser light stabilization is thus enabled.

Then at steps S6–S11, a reticle-to-wafer positional deviation $\Delta$dx in scan direction, a positional deviation $\Delta$dy in non-scan direction, and a wafer-to-reticle distance $\Delta$D are measured up to and just before start of one scan exposure (steps S6 and S7), and, if the measured values are less than corresponding thresholds d0x, d0y and D0, one scan exposure is performed from a predetermined position (steps S8 and S11). Then, sequence goes to step S12. Measurement of $\Delta$dx and $\Delta$dy is performed on the basis of outputs of a linear scale or a laser interferometer, for example, for measuring the stage position or, alternatively, it is performed by detecting positional deviation by using alignment marks provided on the reticle and the wafer. Also, the sampling of $\Delta$dx, $\Delta$dy and $\Delta$D is done in synchronism with or out of synchronism with an output of the stage position measuring means such as a linear scale or a laser interferometer, for example. The synchronization may be made with respect to the laser emission. If any of $\Delta$dx, $\Delta$dy and $\Delta$D is not less than a corresponding threshold, the exposure process does not start, and laser emission is stopped (steps S8 and S9). Until the count n exceeds the number of trials $E_{13}$TIMES as determined at step S1, the procedure at steps S4–S10 is repeated (step S10). If the exposure failure continues until the trial number $E_{13}$TIMES is exceeded, the threshold setting is changed or maintenance of the exposure apparatus is performed.

After the one scan exposure, discrimination is made as to whether all exposures in one wafer are completed or not. If completed, the exposure procedure to a subsequent wafer is performed. If not, sequence goes back to step S2, and the procedure at steps S2–S12 is repeated.

By controlling the scanning exposure apparatus in the manner described above, it is enabled to conduct the exposure process with suppressed focus error and alignment error.

[Embodiment 2]

Basic concept of this embodiment is as follows.

Figure 7:
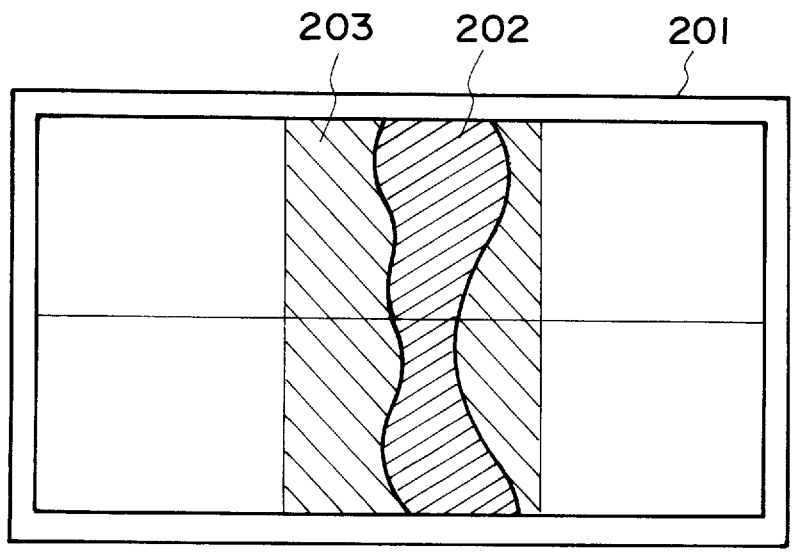
FIG. 7 is a schematic view for explaining a basic concept about non-good exposure, in an embodiment of the present invention.

When a semiconductor exposure apparatus having a pulse light source is used to perform the exposure process, in synchronism with pulse light emission timing, the state or status of exposure, i.e., various error factors generated in relation to the exposure process, such as a stage synchronous error between an original and a substrate, an error in focus direction and non-uniformness of exposure strength, for example, is detected and specific evaluation is made thereto. By setting a particular threshold to the evaluation result, for example, it is possible to determine "no-good exposure" or "defective exposure" beforehand. In a case of such defective exposure, if all the chips in the shot are abandoned, the production efficiency slows down considerably. In consideration of this, the defective exposure region within the shot is memorized, and corresponding data is produced. Those chips in that defective exposure region are abandoned, and operation check or any other inspection is no more executed to those chips. In other words, any defective exposure region within a shot is detected immediately and those chips included in that region are excluded as "defective chips". Then, the subsequent procedure is performed. This makes it possible to increase the production efficiency remarkably and lowers the production cost significantly, particularly when it is compared with a case where defective chips are not determined and excluded on the basis of the state of exposure in the scanning exposure. FIG. 7 illustrates the basic concept of this embodiment as described above.

Denoted in FIG. 7 at 201 is a region (exposure field) which is to be exposed in one scan with a series of pulses of light. Denoted at 202 is a region in which defective exposure has occurred. Denoted at 203 is a region of chips, which includes the defective exposure region 202. Generally, defective exposure occurs locally, as depicted by region 202. Thus, only the chips 203 are influenced by such defective exposure. Therefore, the state of exposure of the chips other than chips 203 is good, and only chips 203 should be handled as defective chips.

Figure 8:
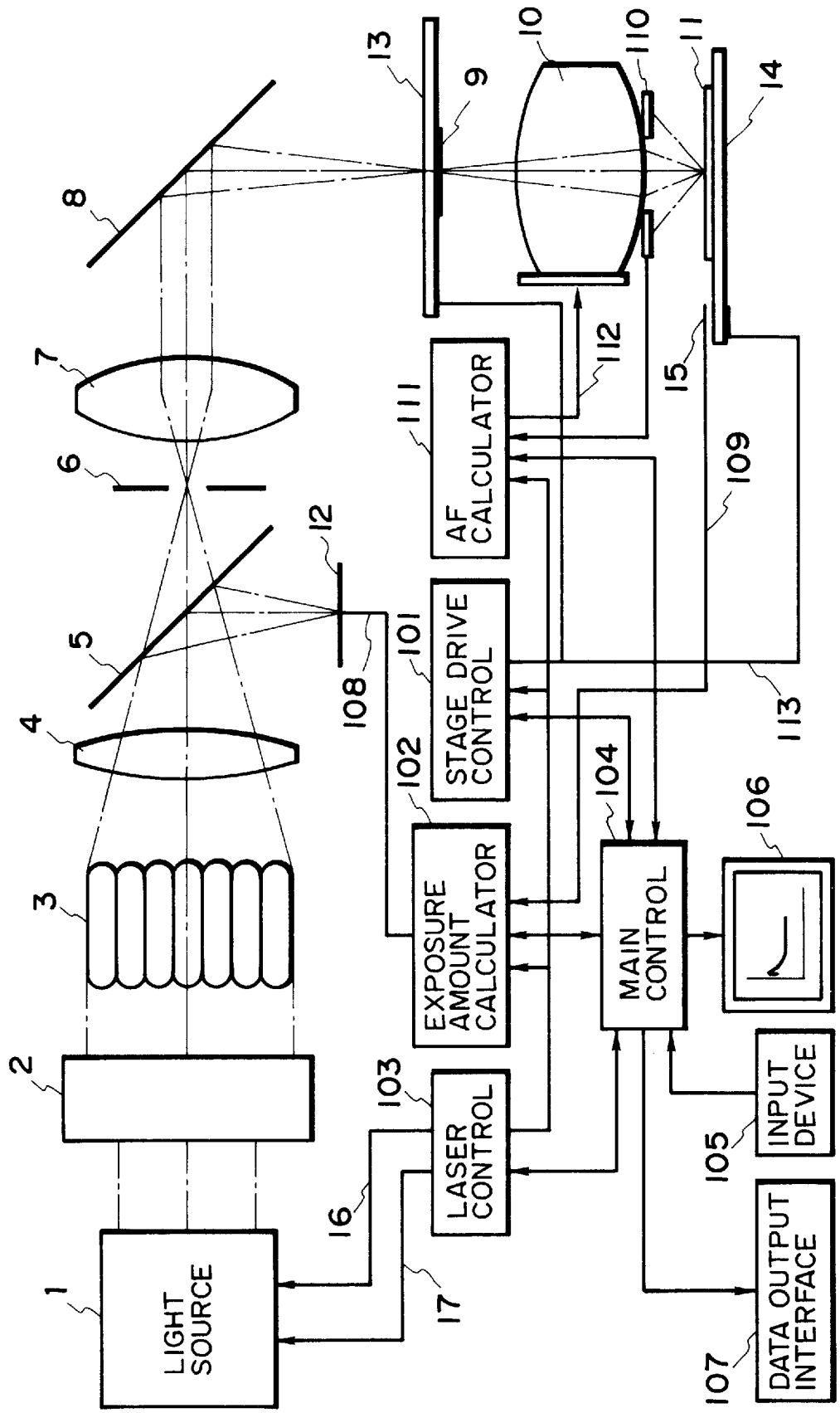
FIG. 8 is a schematic and diagrammatic view of a semiconductor exposure apparatus according to another embodiment of the present invention.

FIG. 8 is a schematic view of a scanning exposure apparatus according to a second embodiment of the present invention, which apparatus can be used for manufacture of semiconductor devices such as ICs or LSIs, for example, or liquid crystal devices, image pickup devices such as CCDs, or magnetic heads, for example. In the drawing, light from a light source 1 comprising an excimer laser, for example, for providing pulse light, is shaped by a beam shaping optical system 2 into a desired shape, and it is then directed to a light entrance surface of an optical integrator 3 which comprises a fly's eye lens, for example. The fly's eye lens comprises a combination of small lenses, and it defines secondary light sources in the vicinity of a light exit surface thereof.

Denoted at 4 is a condenser lens which serves to perform Koehler illumination of a masking blade 6 with light from the secondary light sources of the optical integrator 3. The masking blade 6 and a reticle 9 are disposed in an optically conjugate relation with each other with respect to an imaging lens 7 and a mirror 8. Thus, the shape of an opening of the masking blade 6 determines the shape and size of an illumination region upon the reticle 9, and in synchronism with movement of the reticle, it is scanned. Denoted at 10 is a projection optical system for projecting a circuit pattern, formed on the reticle 9, on to a semiconductor substrate 11 in a reduced scale. The reticle 9 is held fixed upon a reticle stage 103, and it is set in alignment with the semiconductor substrate 11 which is held fixed upon a wafer stage 104. Mounted on the wafer stage 14 is an exposure amount detector 15 for monitoring the exposure amount via the optical system 10. Denoted at 12 is another exposure amount detector for monitoring a portion of pulse light as divided by a half mirror 5.

Control system comprises a laser control system 103, an exposure amount calculating device 102, a stage drive control system 101, an AF calculating device 111, and a main control system 104 which serves to control theses control systems and computing functions of them. The laser control system 103 receives a laser emission light intensity and emission timing signal as calculated at the main control system 104 so as to attain a target exposure amount, and it controls laser pulse energy and laser emission interval (spacing) of the light source 1 in accordance with a trigger signal 16 and a charging voltage signal 17. Prior to start of actual exposure process, and on the basis of illuminance detected signals 108 and 109 from the exposure amount detectors 12 and 15, the exposure amount calculating means 102 takes correlation between detection periods of them, and based on this, the exposure amount on the wafer is predicted only by using data from the exposure amount detector 12 during actual exposure process. The stage drive control system 101 detects current positions of the reticle stage 13 and the wafer stage 14, and it supplies corresponding data to the main control system 104. Also, it serves to produce a stage signal 113 on the basis of a stage drive signal applied thereto from the main control system 104, to drive the stages 13 and 14. The AF calculating means 111 produces a projection lens drive signal 112 on the basis of data supplied thereto from an AF optical system 110, to control the focus. The state of focus at that moment is transmitted to the main control system 104. Focus target value is on the other hand supplied to it from the main control system 104.

The laser control system 103, exposure amount calculating means 102, stage drive control system 101 and the AF calculating means 111 described above all operates in synchronism with a trigger signal, for emission of pulse light, and they produces data, respectively. The main control system 104 includes an input device 105 with which the state of exposure can be inputted, a data output interface 107 with which the state of exposure can be outputted, and a display 106 with which the state of exposure can be displayed graphically. The main control system 104 serves to receive data from the above-described control systems, such as pulse light intensity, stage position and state of focus, for example. By using these data, it performs control computation for achieving the target exposure amount as inputted through the input device 105. On the basis of the results of computation, an emission intensity designation signal for pulse light, a stage drive signal and a focus target signal, for example, are supplied to corresponding calculating means or control means.

Figure 9:
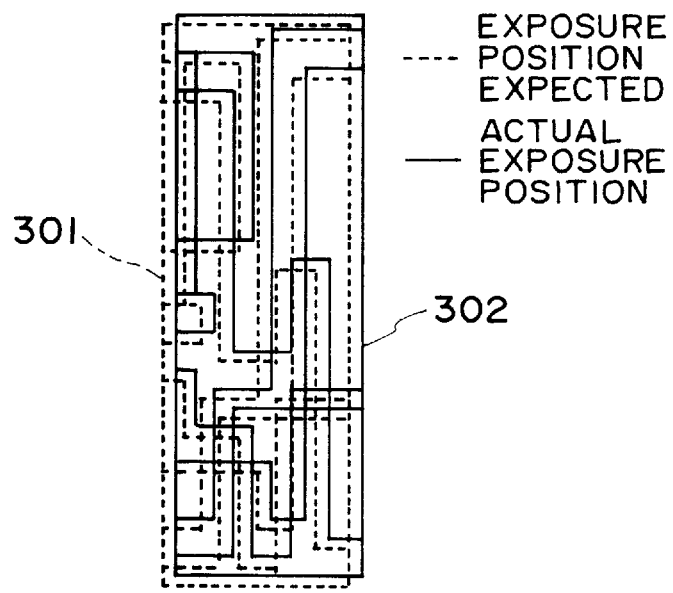
FIG. 9 is a schematic view for explaining a synchronous error.

Next, a first method for discrimination of defective exposure will be explained. Factors which cause defective exposure of a semiconductor chip may include a synchronous positional error between the reticle 9 and the wafer 11. FIG. 9 illustrates such synchronous positional error. In a semiconductor exposure apparatus, for movement between shots or for scan with exposure light (in a case of scanning exposure method), a wafer (and also a reticle, in the case of scanning exposure method) should be moved. During this movement, there is a possibility of variation in relative speed of the reticle and the wafer or transmission of vibration due to stage movement. This may cause a phenomenon that the reticle is set to an exposure area (area 302) on the wafer surface, different from the exposure area 301 which is inherently to be exposed. It results in failure of exposure at an intended position on the wafer surface.

Figure 10:
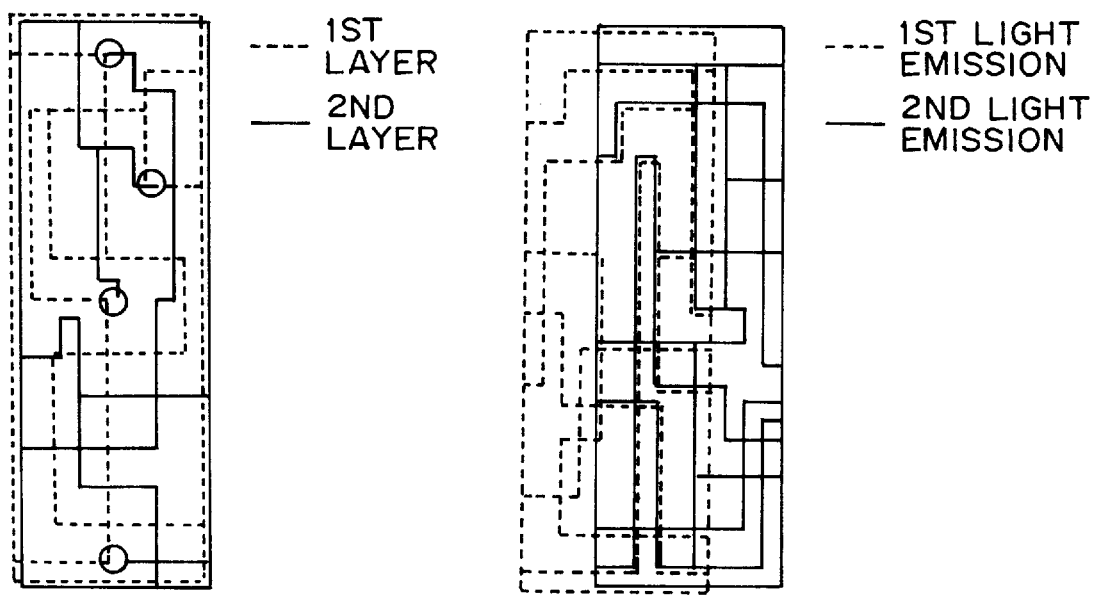
FIG. 10 is a schematic view for explaining details of the error illustrated in FIG. 9.

FIG. 10 illustrates this error in detail. The left-hand half of FIG. 10 illustrates the result of a synchronous error occurred between first and second layers, and the right-hand half illustrates a synchronous error between light emissions. In the left-hand half, due to the synchronous error between the first and second layers, there are disconnections in the portion as enclosed by small circles, in which portions there should inherently be connections between different layers. Thus, construction of a desired circuit ends in failure. In the right-hand half, there is a synchronous error between a first light emission and a second light emission, and formation of a desired circuit also ends in failure. In consideration of this, such an error is detected and if there is defective exposure such as described above, the location of defective exposure is memorized. To such defective exposure region, inspecting operation at the chip inspection stage is not performed. This enables enhanced production efficiency of semiconductor chips.

For calculation of exposure error in synchronism with pulse light emission timing, in the point of direction of synchronous error there may be (i) X-axis direction (scan direction), (ii) Y-axis direction (slit lengthwise direction), (iii) Z-axis direction perpendicular to X–Y plane, (iv) rotational direction $\omega_X$ about X axis, (v) rotational direction $\omega_Y$ about Y axis, and (vi) rotational direction $\omega_Z$ about Z axis. These factors should be considered when defectiveness of semiconductor chip production is discriminated. For discrimination of defective exposure, there is a method in which absolute values of errors in these directions are accumulated with respect to each pulse light emission and, if the sum exceeds a predetermined threshold, exposure of that portion is concluded as defective. Another example is that, for reduced calculation load, a maximum error is preset with respect to each of the directions of error and, when it is exceeded, the exposure of that portion is concluded as defective.

When an error in X-axis direction is denoted by $\Delta_x$, an error in Y-axis direction is denoted by $\Delta_y$ and a rotational error about Z-axis is denoted by $\omega_z$ and if the position in the plane of exposure area to be taken as a reference is denoted in terms of coordinates as (x, y), then in a case where errors occurred in the X-axis direction, Y-axis direction and rotational direction about Z axis, each point can be expressed by coordinate transformation such as equation (1) below:

$$\{(x+\Delta_x) \cos \omega_z (y+\Delta_y) \sin \omega_z, (x+\Delta_x) \sin \omega_z + (y+\Delta_y) \cos \omega_z\} \quad (1)$$

Thus, there may be a method in which the distance between the coordinate after transformation and the coordinate before transformation is calculated, in which, with regard to each point in the exposure area, such distance is accumulated during light emissions, and in which a threshold is set to the result of accumulation by which discrimination of defective exposure is made. Also, there may be a method in which a threshold is set to the total of results of accumulations at respective points in the exposure area, by which defective exposure is discriminated. If a threshold is set to the result of accumulation of distance at each point for discrimination of defective exposure, when the threshold is exceeded, the whole of that exposure area may not be concluded as defective but a defective exposure region within the exposure area can be determined. Thus, in that case, it is possible to exclude only the chip or chips including the defective exposure portion within the exposure area, and, therefore further increase of chip production efficiency is enabled. It is to be noted that errors $\Delta x$, $\Delta y$ and $\omega_z$ used here are optimum values each of which can be determined by, for example, using plural measurement points and by averaging the measured values.

As regards defective exposure discrimination in relation to different layers, from a reticle-to-wafer synchronous error at the same position in shot and by using a discrimination criterion such as described above, the state of exposure at that position can be discriminated.

Next, a second method for discrimination of defective exposure will be explained. When a semiconductor chip is exposed, a deviation in reticle-to-wafer distance causes a deviation in focal length of an optical system, which then leads to an exposure error. Such error in focal length influences sharpness of a pattern which is being formed with an exposure apparatus. It is possible that, when an exposure error of a semiconductor chip is to be detected in synchronism with pulse light emission timing, defective exposure is discriminated while taking into account an error z influential to local length, a rotational error $\omega_X$ about X axis, and a rotational error $\omega_Y$ about Y axis. For discrimination, there may be a method in which absolute values of errors in these directions are accumulated and in which whether the sum exceeds a preset threshold or not is checked, defective exposure being concluded if the threshold is exceeded. Also, there may be a method in which, for simplification of calculation, each of errors in these directions is compared with a corresponding error threshold determined beforehand and in which, if the threshold is exceeded, exposure of that portion is concluded as defective. Further, when a coordinate system on the wafer surface is such that the scan direction is denoted by X, the slit lengthwise direction is denoted by Y, rotational directions about these axes are denoted by $\omega_X$ and $\omega_Y$, and a direction of normal to the plane containing X and Y axes is denoted by Z, if rotational errors $\omega_X$ and $\omega_Y$ are applied to such wafer coordinate system, coordinate transformation such as equation (2) below may apply:

$$(x,y,z) \xrightarrow{A} (x',y',z') \quad (2)$$

where $$A = \begin{bmatrix} \cos\omega_Y & 0 & -\sin\omega_Y \\ 0 & 1 & 0 \\ \sin\omega_Y & 0 & \cos\omega_Y \end{bmatrix} \begin{bmatrix} 1 & 0 & 0 \\ 0 & \cos\omega_X & -\sin\omega_X \\ 0 & \sin\omega_X & \cos\omega_X \end{bmatrix}$$

If the wafer surface before the errors are applied is Z=0, the wafer surface after the rotational error and the Z-axis direction error $\Delta_z$ are applied is expressed by equation (3) below:

$$x \sin\omega_y + y \cos\omega_y \sin\omega_X + (z-\Delta_z) \cos\omega_Y \cos\omega_X = 0 \quad (3)$$

Therefore, it is a possible method that the coordinate on the exposure area is substituted into equation (3), and that the distance (error) in focus direction is detected and a threshold is set to this error. Also, there may be a method in which errors at respective points in the exposure area are accumulated and a threshold is set to the total.

It is to be noted that errors $\Delta z$, $\omega_X$ and $\omega_Y$ used here are optimum values each of which can be determined by, for example, using plural measurement points and by averaging the measured values.

Figure 11:
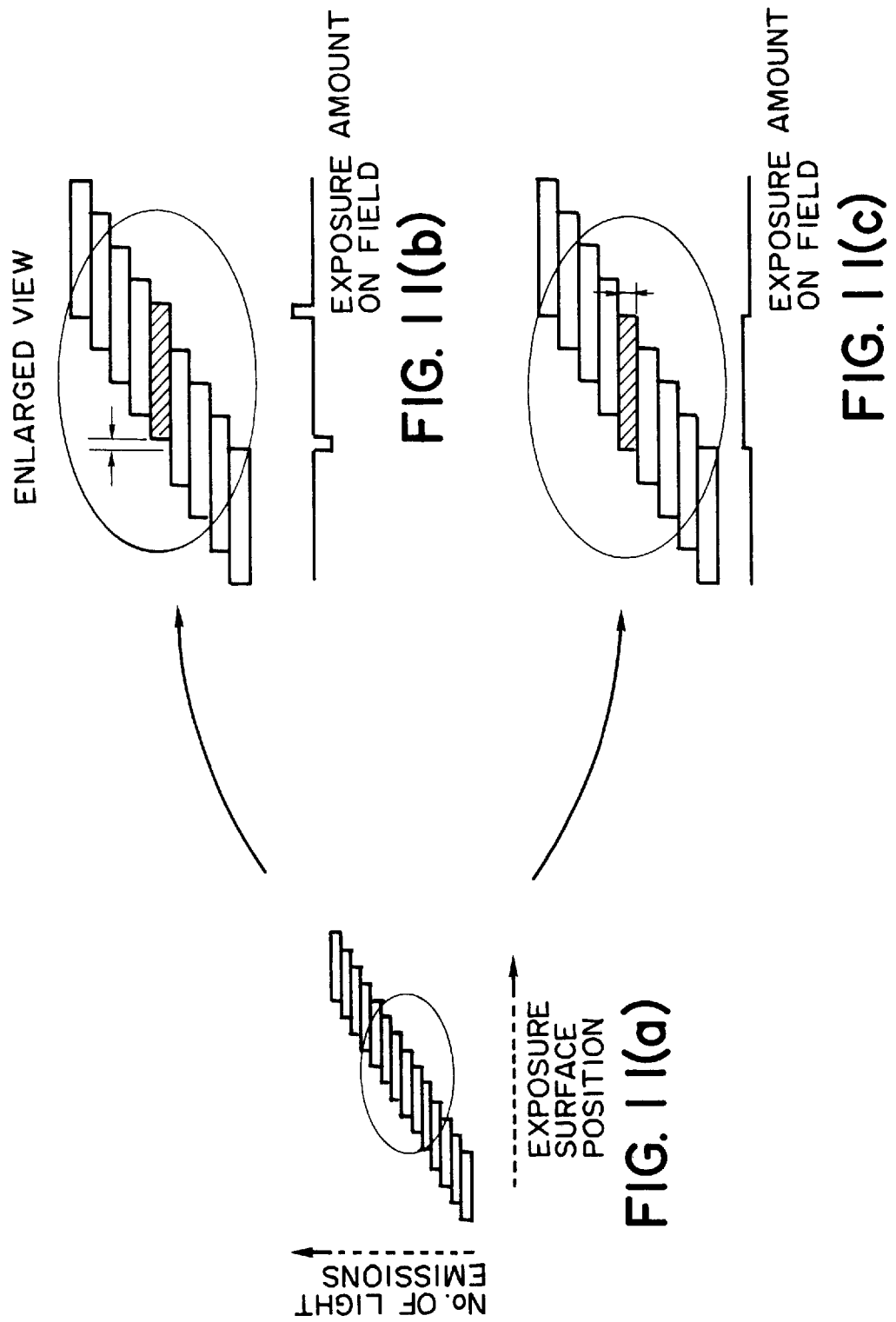
FIG. 11 is a schematic view for explaining how an exposure amount should be applied to a wafer, in a scanning semiconductor exposure apparatus having a pulse light source.

Next, a further method for discrimination of defective exposure will be explained. In a semiconductor exposure apparatus, since the exposure amount on the wafer surface is influential, for example, to the line width of a pattern to be printed, uniform exposure amount is desired. FIG. 11 illustrates how exposure amount should be applied to a water, in a scan type semiconductor exposure apparatus having a pulse light source. In the stair-like portions as illustrated, each step corresponds to pulse light of slit-like shape. The position of each step in lateral direction corresponds to the position on the exposure field, while the length in longitudinal direction corresponds to the intensity of the pulse light. In a case as depicted in the portion (a) of FIG. 11 wherein there is no error in the pulse light emission intensity and the light emission position thereof, idealistic exposure is performed and uniform exposure amount is applied to the wafer surface. Portions (b) and (c) of FIG. 11 illustrate cases where idealistic exposure is not performed. The portion (b) of FIG. 11 shows a state of exposure in a case where the light emission position is slightly shifted, and the portion (c) of FIG. 11 shows a case where the light emission intensity of a pulse is shifted as compared with that of other pulses. As regards factors for an error in light emission position, causing variation in exposure amount upon the wafer surface, there may be an error in pulse light emission position due to a synchronous error between the reticle stage and the wafer stage or to a mechanical noise resulting from such synchronous error. As for the direction of such positional error, there may be scan direction X, slit lengthwise direction Y, focus direction Z and rotational errors $\omega_X$, $\omega_Y$ and $\omega_Z$ about these axes. Thus, when a scan type semiconductor exposure apparatus is to be used practically, the emission intensity and emission position of each pulse light should be detected in synchronism with the emission of that pulse light, the state of exposure upon the water surface should be determined while taking into account the errors involved in them, and then the exposure amount error should be calculated. From the viewpoint of exposure amount error in a static type exposure apparatus, since only variation of pulse light emission intensity may be the factor of exposure amount error, only the intensity error may be considered.

In terms of sequence of semiconductor exposure process, after an alignment operation is conducted the exposure (emission of pulse light) is performed. Thus, for good exposure, an error with respect to the exposure position should be calculated and then the exposure amount control should be performed to cancel the effect of such error, to thereby suppress the exposure amount error in that portion to a level less than a tolerance. However, in a case where the positional error is large so that the exposure amount error at that portion can not be reduced to the tolerance through exposure amount control, or in a case where, while the light emission position error is within a tolerable range, the intensity of light emitted has a large error so that it can not be corrected by a subsequent light emission or emissions, such portion may be concluded as being defective exposure. The position of defective exposure portion may be memorized, and corresponding information may be used for chip quality discrimination.

Figure 12:
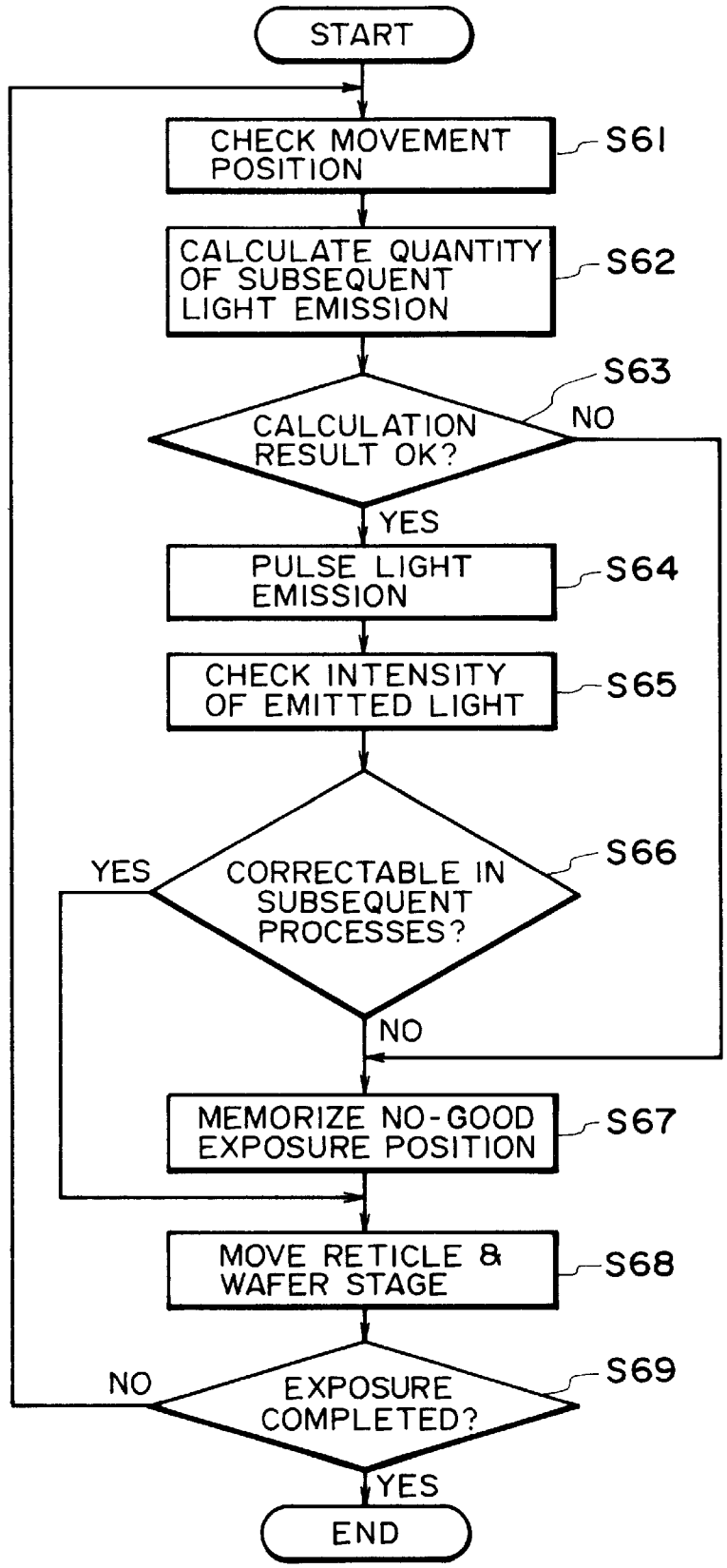
FIG. 12 is a flow chart for explaining a non-good exposure discrimination procedure.

FIG. 12 is a flow chart of exposure procedure to one exposure field, wherein defective exposure discrimination is performed. When the exposure procedure starts, the reticle stage and the wafer stage are moved. As they reach the exposure position, the position moved is checked (step S61). Checking includes measurement of X, Y, Z, $\omega_X$, $\omega_Y$ and $\omega_Z$. Then, while taking into account the position moved, as measured, the light emission intensity for a subsequent light pulse is calculated (step S62). Then, discrimination is made as to whether a required exposure error can be satisfied by controlling the light intensity of a subsequent emission (step S63). If it can be satisfied, the pulse light emission is executed in accordance with the result of calculation of the light emission intensity (step S64). Since the pulse light thus emitted may involve variation, the light emission intensity provided with variation is checked (step S65). Then, discrimination is made as to whether the exposure error provided by the last emission can be corrected into a tolerable error range by controlling a subsequent light pulse while taking into account that error and an error such as a stage positioning error, for example (step S66). If at step S63 or S66 it is concluded that the required exposure error can not be satisfied or the error can not be corrected, such defective exposure position is memorized (step S67) and the sequence goes to step S68. If at step S66 it is concluded that correction is not possible, the sequence directly goes to step S68. At step S68, the reticle stage and the wafer stage are moved to a subsequent exposure position. Then, whether all exposures have been completed or not is discriminated (step S69). If completed, the exposure operation is finished. If not, the sequence goes back to step S61.

When the validity of exposure in a semiconductor exposure apparatus using a pulse light source is to be discriminated, practically it is not appropriate to use any of the error evaluation criteria described above, independently of the others. At least two of them may be used for discrimination. In that case, appropriate weighting may be made to respective criteria, for composite evaluation of the errors, to discriminate defective exposure.

It is an alternative method that defective exposure is discriminated on the basis of a synchronous error between the masking blade and the stage system. In the scanning exposure, for shaping of the beam shape to be projected on to the reticle stage to regulate the beam irradiation region, the masking blade is moved in synchronism with the reticle stage movement, that is, the reticle movement. If however there is a synchronous error between the masking blade and the reticle stage, defective exposure results therefrom. Thus, the relative position of the masking blade and the reticle stage may be detected in the scanning exposure and, by using it, the state of exposure may be discriminated and whether exposure of that exposure area is defective or not may be discriminated. As regards relative positional factors, there may be directions of X, Y, Z, $\omega_X$, $\omega_Y$ and $\omega_Z$. As for discrimination method, like the defective exposure region discrimination method based on stage synchronous error, tolerable errors may be preset in relation to respective directions and synchronous error calculation may be made with regard to plural positions with in the region to be examined, and a largest error may be used for the discrimination. There may be another method in which a threshold may be set to the sum of measured errors, for defective exposure discrimination. It may be an alternative method that a threshold may be set to a result of statistical processing to errors at measuring points.

In accordance with any of such discrimination methods, the state of exposure is discriminated on the basis of an error, attributable to a synchronous error between the masking blade and the reticle stage. The portion as concluded as defective exposure is memorized, such that after that the exposure operation to such portion may be reduced or the inspection operation to such portion may be omitted. This effectively enhances the production efficiency.

Figure 13A:
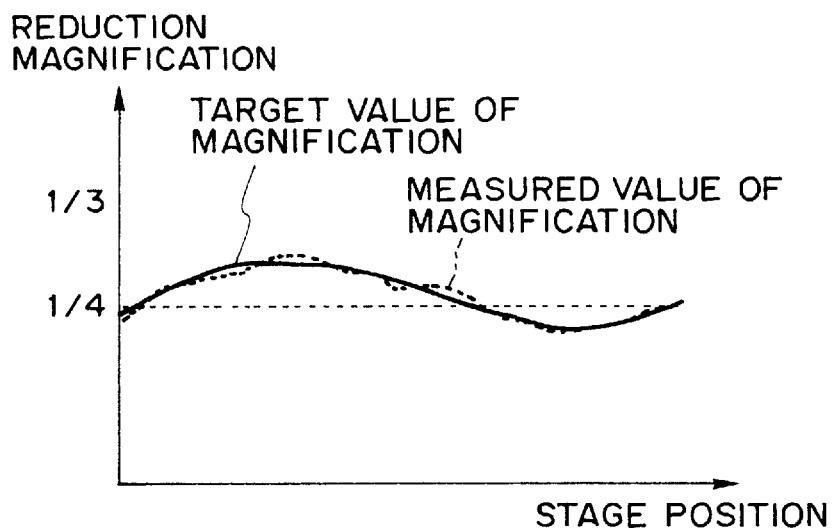
FIGS. 13A and 13B are graphs for explaining variation caused with changes in a reduction magnification of a projection system, during scanning exposure.
Figure 13B:
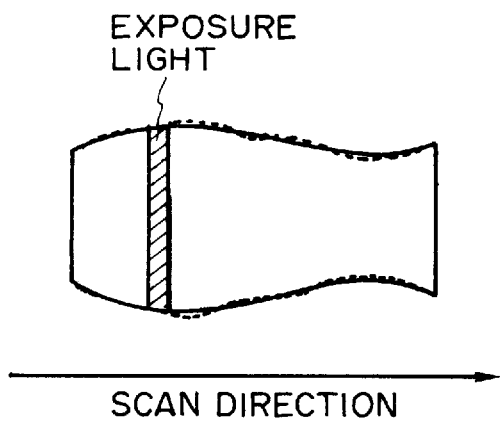

There are cases wherein in the scanning exposure a target reduction ratio of a projection optical system is set to the stage position. In that occasion, the reduction magnification of the projection optical system should be controlled with respect to the stage position, in real time. However, there is a possibility of an error between the target reduction ratio of the projection optical system and the actual reduction ratio thereof. FIG. 13 illustrates a case where the reduction magnification of a projection optical system varies during the scanning exposure. Specifically, portion (A) of FIG. 13 shows the reduction magnification of the projection optical system at the scan position. Curved broken line corresponds to a case where the target reduction magnification is constant. However, there is a possibility that at the scan position the reduction magnification changes as depicted by a solid line. In that occasion, the region to be printed on a water will be such as enclosed by a solid line in the portion (B) of FIG. 13. However, if the actual reduction magnification is such as depicted by the broken line in FIG. 13, (A), the region to be printed on the wafer will be such as enclosed by a broken line in FIG. 13, (B). If the shape of this broken line considerably differs from that of the solid line, image distortion results locally or wholly on the surface exposed. This influences overlaying of subsequent layers. It is therefore desirable to discriminate the state of exposure on the basis of an error between a target reduction magnification and actual reduction magnification, of a projection optical system at a scan position.

The concept of the present invention is applicable to such an error of a projection optical system. That is, an actual reduction magnification of a projection optical system corresponding to each pulse light exposure may be detected by using reduction magnification detecting means and, if the error of reduction magnification of the projection optical system with respect to a target reduction magnification is large, exposure may not be performed but re-exposure may be performed. For error discrimination, a threshold may be set with respect to a certain evaluation criterion and the state of exposure may be discriminated with reference to that threshold. As for the threshold setting, there may be a method in which a threshold is set to the amount of deviation itself from the target reduction magnification, and a method in which deviation from a target value may be measured at plural measurement points in the scan field and a threshold is set to a statistical value which is obtainable by statistically processing measured deviations. Further, there may be an alternative method based on a circuit pattern. That is, if, for example, a circuit pattern has a complicated structure as compared with other portions such that more strict precision is required to the reduction magnification, then, as an example, weighting may be made to measured values at plural measurement points and a threshold may be set to the deviation. It may be a further alternative to set a threshold to the result of statistical operation.

In accordance with any of such discrimination methods, defective exposure attributable to an error of reduction magnification of a projection optical system can be discriminated. The portion as concluded as defective exposure is memorized, such that after that the exposure operation to such portion may be reduced or the inspection operation to such portion may be omitted. This effectively enhances the production efficiency.

FIG. 14 is a flow chart of a dicing operation for cutting a wafer into chips after the semiconductor chip exposure. The location or locations of defective exposure have been determined in accordance with any of the discrimination methods described hereinbefore and memorized in a memory, for example. In the dicing operation, such defective exposure position is read (step S71), and chip dicing is performed (step S72). After that, the defective exposure position and a current cutting position are compared with each other, and discrimination is made as to whether the chip just having been cut includes the defective exposure region (step S73). If so, that chip is abandoned (step S74), If not so, the sequence directly goes to movement to a subsequent cutting position (step S75). Then, whether the current position is within the dicing range is discriminated (step S76) and, if so, the sequence goes back to step S72, and dicing operation is repeated. If the position is out of the dicing range, the dicing operation is finished.

Figure 15:
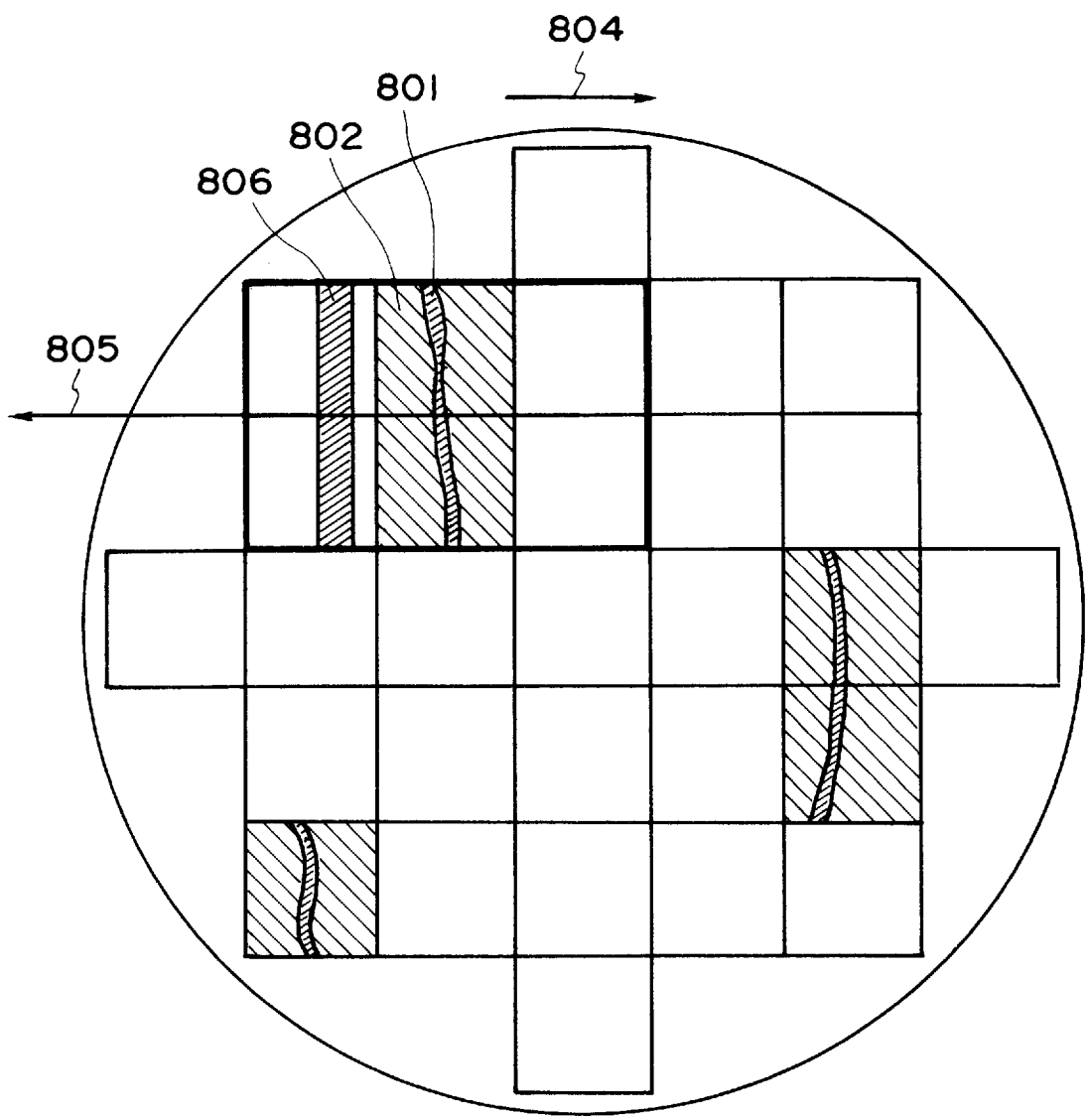
FIG. 15 is an enlarged view, showing an example of display at a display device of a semiconductor exposure apparatus.

The state of exposure on the wafer surface may be displayed at a display device provided in the exposure apparatus, for operator's information. FIG. 15 illustrates an example of display, wherein defective exposure regions are depicted at 801. Chips denoted at 802 are those chips that include defective exposure regions.

[Embodiment 3]

Figure 16:
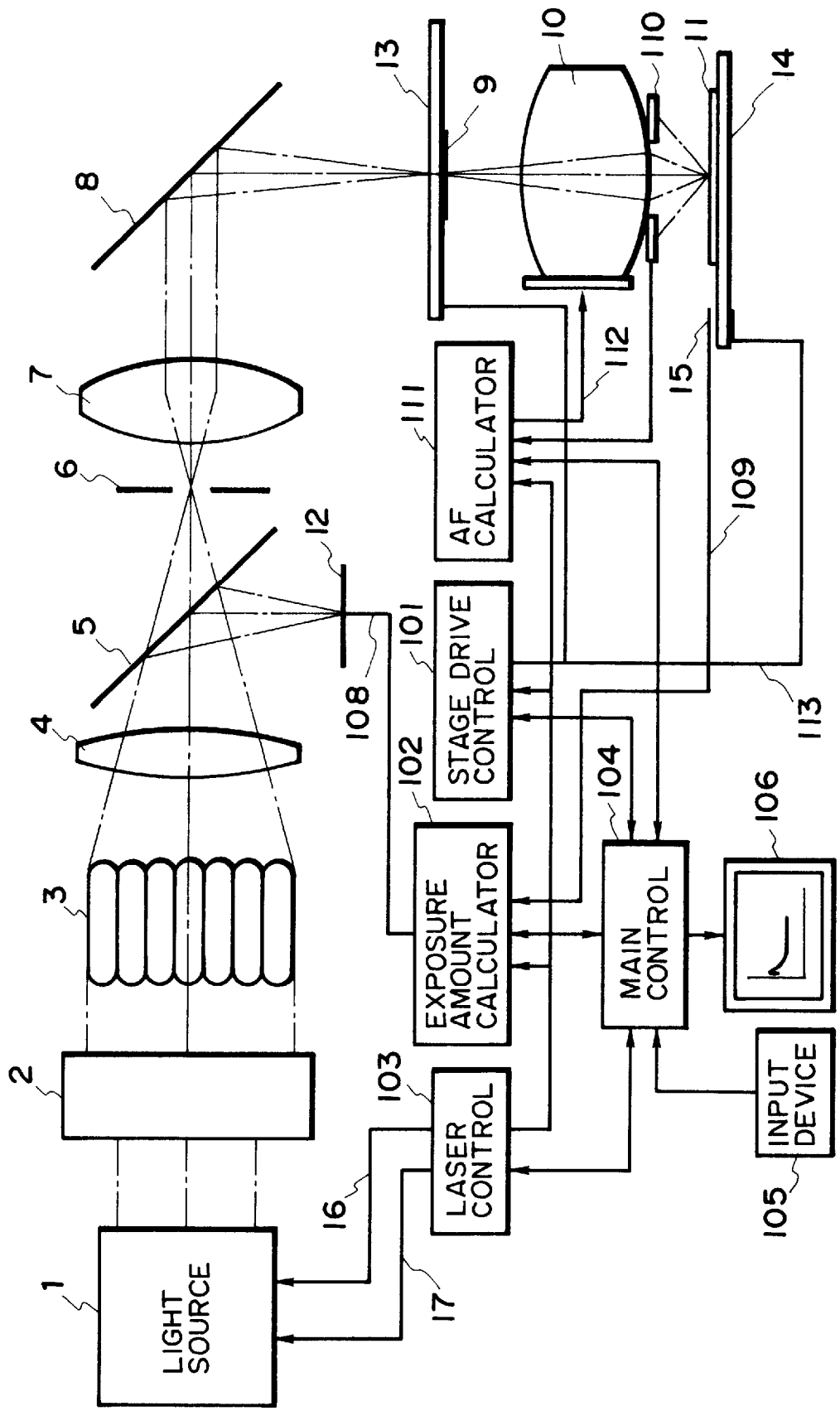
FIG. 16 is a schematic and diagrammatic view of a scanning exposure apparatus according to a further embodiment of the present invention.

FIG. 16 is a schematic view of a scanning exposure apparatus according to a third embodiment of the present invention, which apparatus can be used for manufacture of semiconductor devices such as ICs or LSIs, for example, or liquid crystal devices, image pickup devices such as CCDs, or magnetic heads, for example. In the drawing, light from a light source 1 comprising an excimer laser, for example, for providing pulse light, is shaped by a beam shaping optical system 2 into a desired shape, and it is then directed to a light entrance surface of an optical integrator 3 which comprises a fly's eye lens, for example. The fly's eye lens comprises a combination of small lenses, and it defines secondary light sources in the vicinity of a light exit surface thereof.

Denoted at 4 is a condenser lens which serves to perform Koehler illumination of a masking blade 6 with light from the secondary light sources of the optical integrator 3. The masking blade 6 and a reticle 9 are disposed in an optically conjugate relation with each other with respect to an imaging lens 7 and a mirror 8. Thus, the shape of an opening of the masking blade 6 determines the shape and size of an illumination region upon the reticle 9, and in synchronism with movement of the reticle, it is scanned. Denoted at 10 is a projection optical system for projecting a circuit pattern, formed on the reticle 9, on to a semiconductor substrate 11 in a reduced scale. The reticle 9 is held fixed upon a reticle stage 103, and it is set in alignment with the semiconductor substrate 11 which is held fixed upon a wafer stage 104. Mounted on the wafer stage 14 is an exposure amount detector 15 for monitoring the exposure amount via the optical system 10. Denoted at 12 is another exposure amount detector for monitoring a portion of pulse light as divided by a half mirror 5.

Control system comprises a laser control system 103, an exposure amount calculating device 102, a stage drive control system 101 an AF calculating device 111, and a main control system 104 which serves to control theses control systems and computing functions of them. The laser control system 103 receives a laser emission light intensity and emission timing signal as calculated at the main control system 104 so as to attain a target exposure amount, and it controls laser pulse energy and laser emission interval (spacing) of the light source 1 in accordance with a trigger signal 16 and a charging voltage signal 17. Prior to start of actual exposure process, and on the basis of illuminance detected signals 108 and 109 from the exposure amount detectors 12 and 15, the exposure amount calculating means 102 takes correlation between detection periods of them, and based on this, the exposure amount on the wafer is predicted only by using data from the exposure amount detector 12 during actual exposure process. The stage drive control system 101 detects current positions of the reticle stage 13 and the wafer stage 14, and it supplies corresponding data to the main control system 104. Also, it serves to produce a stage signal 113 on the basis of a stage drive signal applied thereto from the main control system 104, to drive the stages 13 and 14. The AF calculating means 111 produces a projection lens drive signal 112 on the basis of data supplied thereto from an AF optical system 110, to control the focus.

The state of focus at that moment is transmitted to the main control system 104. Focus target value is on the other hand supplied to it from the main control system 104.

The laser control system 103, exposure amount calculating means 102, stage drive control system 101 and the AF calculating means 111 described above all operates in synchronism with a trigger signal, for emission of pulse light, and they produces data, respectively. The main control system 104 includes an input device 105 with which the state of exposure can be inputted, a data output interface 107 with which the state of exposure can be outputted, and a display 106 with which the state of exposure can be displayed graphically. The main control system 104 serves to receive data from the above-described control systems, such as pulse light intensity, stage position and state of focus, for example. By using these data, it performs control computation for achieving the target exposure amount as inputted through the input device 105. On the basis of the results of computation, an emission intensity designation signal for pulse light, a stage drive signal and a focus target signal, for example, are supplied to corresponding calculating means or control means.

In a semiconductor exposure apparatus using a pulse light source, in synchronism with pulse light emission, before emission of pulse light, the state of exposure such as a synchronous error as a reticle stage and a wafer stage moves or a deviation in focus direction, for example, is detected, and discrimination is made as to whether the effect of detected positioning error can be adjusted and reduced into an exposure error tolerable range by controlling the light emission intensity of a subsequent pulse. If, as a result, it is concluded that the effect of error can not be removed through the exposure control, emission of pulse light at that position is not performed, and the position is memorized. During period of one shot, the exposure is performed in this manner. After exposure of the one shot, data of unexposed position is read and, with respect to that position, the stage position is adjusted and then the exposure is effected again.

Figure 17:
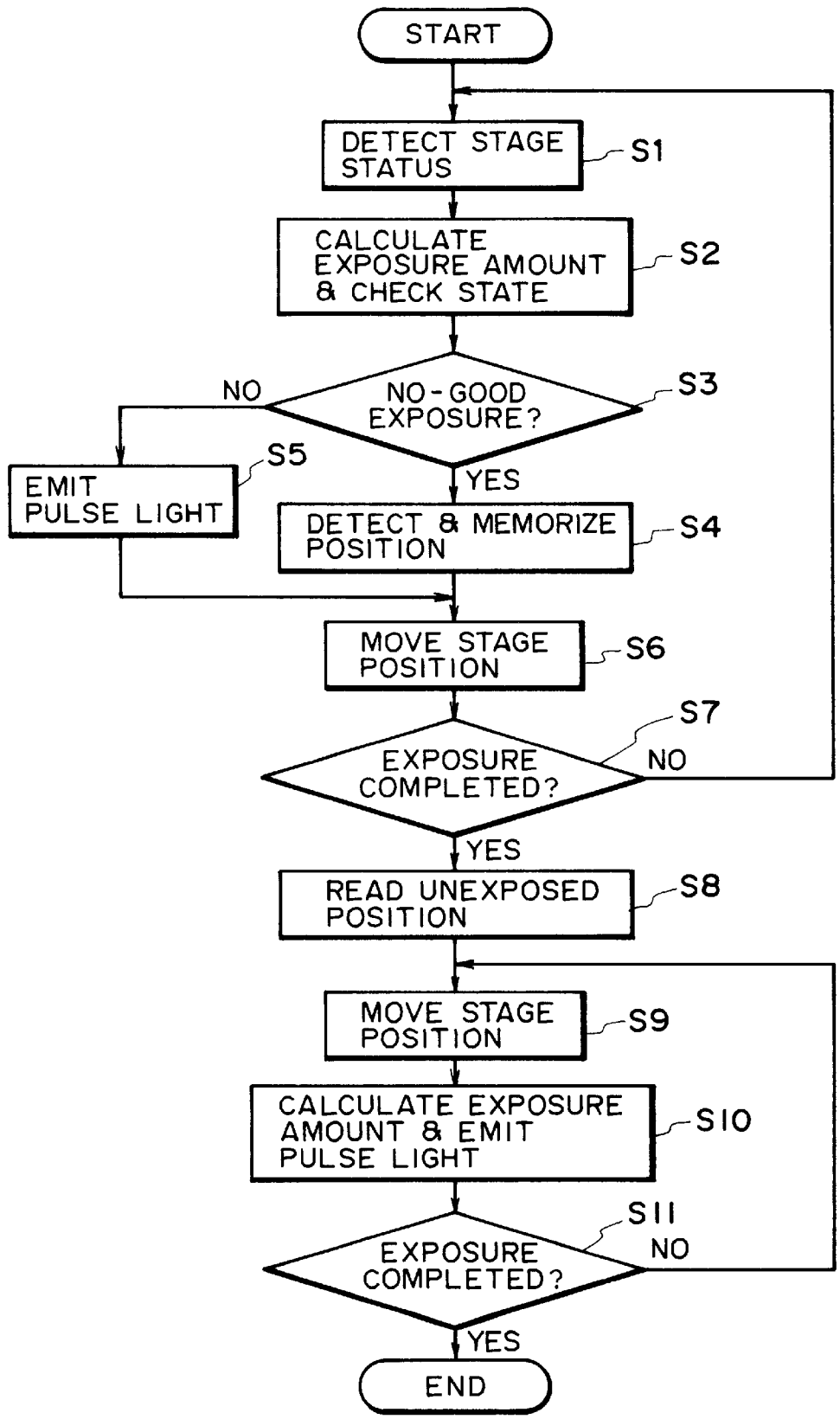
FIG. 17 is a flow chart for explaining a non-good exposure discrimination procedure in the embodiment of FIG. 16.

FIG. 17 is a flow chart of exposure procedure to one exposure field, wherein defective exposure is discriminated. As illustrated, when the exposure procedure starts, the state or status of the stage such as positional errors X, Y, Z, $\omega_X$, $\omega_Y$ and $\omega_Z$ as well as rotational errors of the stage, is detected (step S1). Then, while taking into account the latest exposure hysteresis, discrimination is made as to whether the effect of a detected positioning error can be removed through light intensity control to a subsequent light emission (step S2). If it is not possible to suppress the effect of positioning error to a level within a predetermined exposure amount error range through the light intensity control to subsequent emission, the pulse light emission at that position is not performed. The stage position at that moment is detected and memorized into memory means (step S3). If it is concluded that the effect of positional error can be canceled by controlling the emission light intensity, the pulse light emission is performed on the basis of that result (steps S4 and S5). Then, the stage is moved for exposure of a subsequent region (step 6) and, by detecting the stage position, whether exposure of one shot has been completed or not is discriminated (step S7). If not, the sequence goes back to step S1, and the procedure from stage position detection is repeated. If the exposure is completed, the unexposed position having been memorized is read out (step S8), and the stage is moved to that position (step S9). In that occasion, whether the stage positioning error is in a range not affecting the exposure amount error, should be checked. Then, on the basis of the result of exposure at a portion around that position, the exposure amount at that position is calculated (step S10). The pulse light emission intensity is controlled in accordance with the result of calculation, and light emission is performed. Then, whether all exposures are completed or not is discriminated (step S11). If completed, the exposure operation is finished. If not, the sequence goes back to step S9.

As regards the re-exposure, there may be a few processes. In addition to the method as described above wherein, after completion of exposure of one shot, the exposure is performed again to the defective exposure region as memorized, there may be a method in which, if occurrence of defective exposure is predicted, the stage positioning or focusing with respect to the corresponding position is performed again. Further, there may be a method in which re-exposure is performed when the stage movement direction is changed during exposure of one shot and the scan speed is lowered, or re-exposure may be performed after completion of exposure of one wafer. The timing of performing re-exposure in the exposure procedure may be determined as desired.

Figure 18:
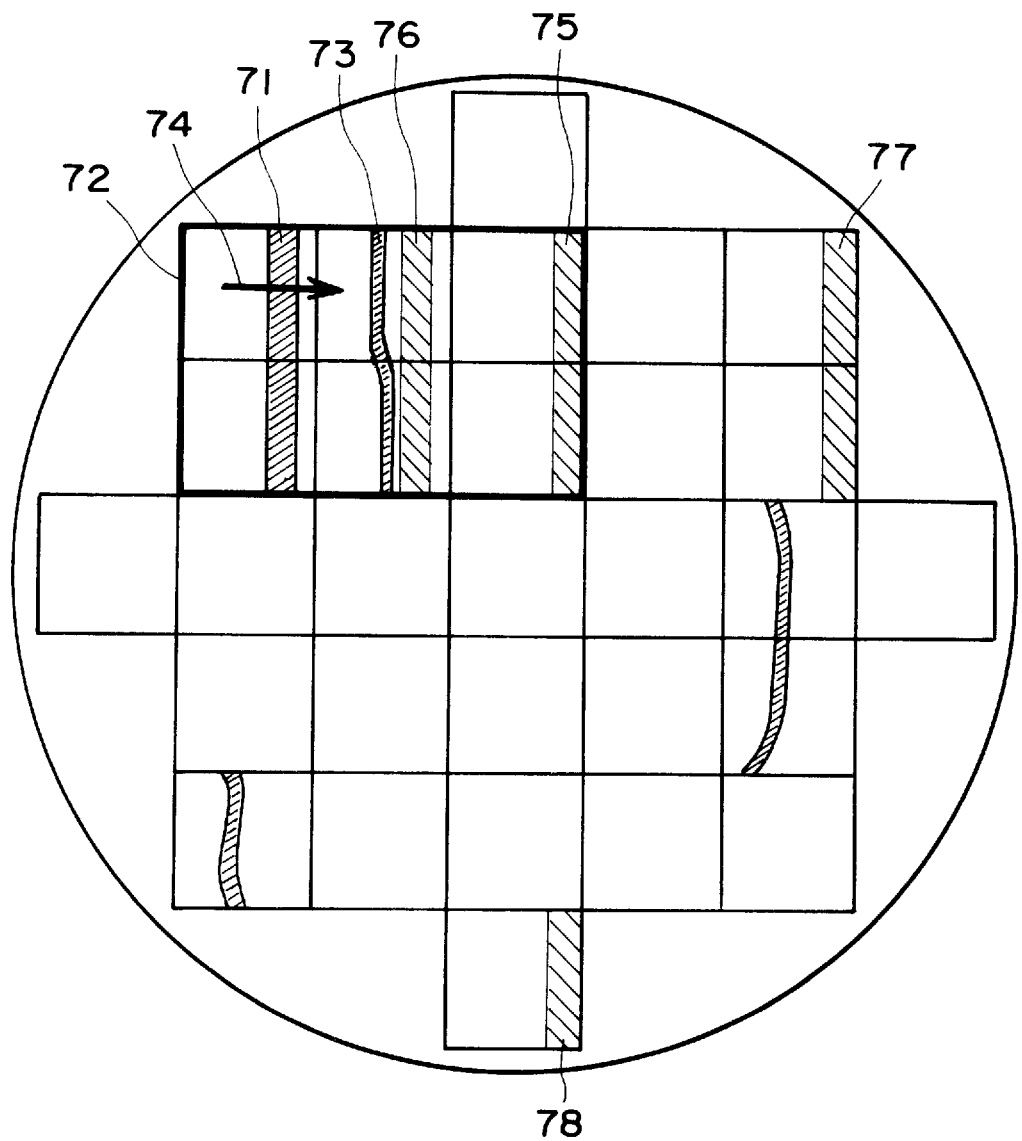
FIG. 18 is a schematic view for explaining the timing of re-exposure.

FIG. 18 illustrates timing of re-exposure. Denoted at 71 is scanning exposure light, and denoted at 72 is the region corresponding to exposure of one shot. Denoted at 73 is a defective exposure portion, and denoted at 74 is a scan direction of exposure light. Denoted at 75 is an end portion of one shot, at which re-exposure may be initiated. Denoted at 76 is the timing as the portion 73 with respect to which defective exposure is predicted is detected. Denoted at 77 is the portion where the scan direction has to be changed during the exposure process, and denoted at 78 is the portion where exposure of the wafer is to be completed. At a portion other than the portion 75, such as a portion 76 or 78, for example, the re-exposure may be performed.

When the re-exposure is to be initiated at timing other than the end of exposure of one shot, the procedure meets it by changing the discrimination criterion in the exposure end discrimination at step S7 of FIG. 17.

Figure 19:
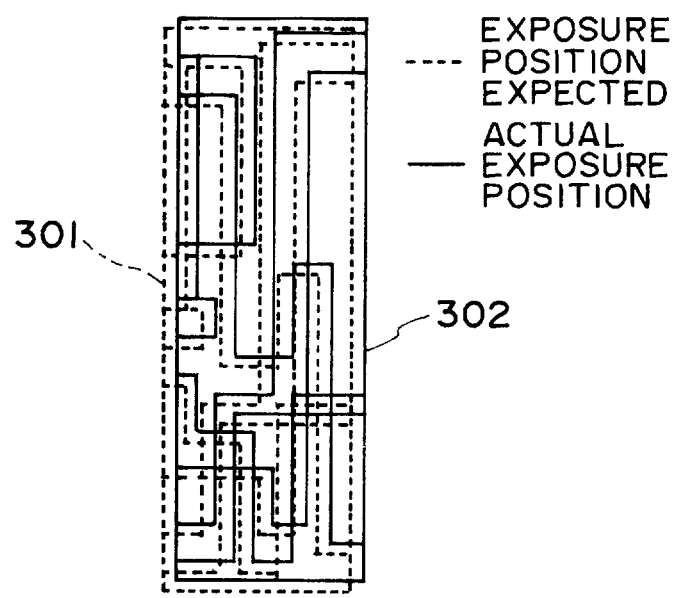
FIG. 19 is a schematic view for explaining a synchronous error.

Next, a method for discrimination of defective exposure will be explained. Factors which cause defective exposure of a semiconductor chip may include a synchronous positional error between the reticle 9 and the wafer 11. FIG. 19 illustrates such synchronous positional error. In a semiconductor exposure apparatus, for movement between shots or for scan with exposure light (in a case of scanning exposure method), a wafer (and also a reticle, in the case of scanning exposure method) should be moved. During this movement, there is a possibility of variation in relative speed of the reticle and the wafer or transmission of vibration due to stage movement. This may cause a phenomenon that the reticle is set to an exposure area (area 302) on the wafer surface, different from the exposure area 301 which is inherently to be exposed. It results in failure of exposure at an intended position on the wafer surface.

Figure 20:
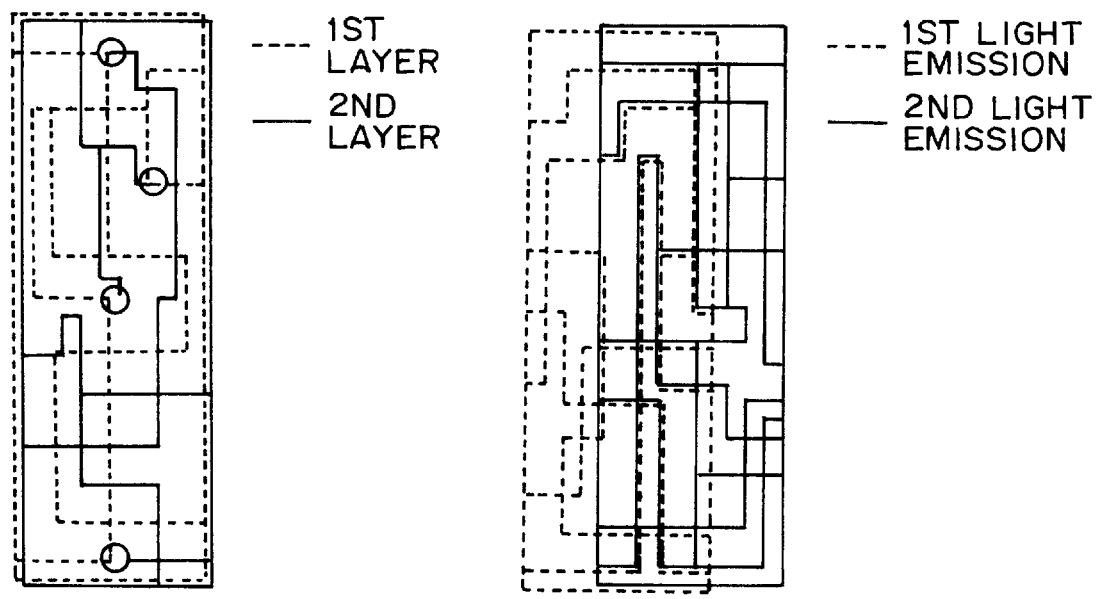
FIG. 20 is a schematic view for explaining details of the error illustrated in FIG. 19.

FIG. 20 illustrates this error in detail. The left-hand half of FIG. 20 illustrates the result of a synchronous error occurred between first and second layers, and the right-hand half illustrates a synchronous error between light emissions. In the left-hand half, due to the synchronous error between the first and second layers, there are disconnections in the portion as enclosed by small circles, in which portions there should inherently be connections between different layers. Thus, construction of a desired circuit ends in failure. In the right-hand half, there is a synchronous error between a first light emission and a second light emission, and formation of a desired circuit also ends in failure. In consideration of this, such an error is detected in synchronism with pulse light and before emission of pulse light. If such defective exposure as described above is predicted, the location of that portion is memorized as an unexposed position, and emission of pulse light is not performed. After completion of exposure of one shot, re-exposure is performed to that position, to thereby prevent defective exposure due to synchronous positioning error.

For calculation of exposure error in synchronism with pulse light emission timing, in the point of direction of synchronous error there may be (i) scan direction X, (ii) slit-lengthwise direction Y, and (iii) rotational error $\omega_Z$ about Z axis. These factors should be considered when defectiveness of semiconductor chip production is discriminated. For discrimination of defective exposure, there is a method in which, at a certain point in the exposure area and with respect to each of the above-described directions, the error is accumulated in response to each pulse emission, are then the thus calculated errors are summed. If the sum exceeds a predetermined threshold, exposure of that portion is concluded as defective. Another example is that, for reduced calculation load, a maximum error is preset with respect to each of the directions of error and, when it is exceeded, the exposure of that portion is concluded as defective.

When an error in X-axis direction is denoted by $\Delta_x$, an error in Y-axis direction is denoted by $\Delta_y$ and a rotational error about z-axis is denoted by $\omega_Z$ and if the position in the plane of exposure area to be taken as a reference is denoted in terms of coordinates as (x, y), then in a case where errors occurred in the X-axis direction, Y-axis direction and rotational direction about Z axis, each point can be expressed by coordinate transformation such as equation (4) below:

$$\{(x+\Delta_x)\cos\omega_z y+\Delta_y)\sin\omega_Z, (x+\Delta_x)\sin\omega_Z+(y+\Delta_y)\cos\omega_Z\} \quad (4)$$

Thus, there may be a method in which the distance between the coordinate after transformation and the coordinate before transformation is calculated, in which, with regard to each point in the exposure area, such distance is accumulated during light emissions, and in which a threshold is set to the result of accumulation by which discrimination of defective exposure is made. Also, there may be a method in which a threshold is set to the total of results of accumulations at respective points in the exposure area, by which defective exposure is discriminated. If a threshold is set to the result of accumulation of distance at each point for discrimination of defective exposure, when the threshold is exceeded, the whole of that exposure area may not be concluded as defective but a defective exposure region within the exposure area can be determined. Thus, in that case, it is possible to exclude only the chip or chips including the defective exposure portion within the exposure area, and, therefore, further increase of chip production efficiency is enabled. It is to be noted that errors $\Delta x$, $\Delta y$ and $\omega_Z$ used here are optimum values each of which can be determined by, for example, using plural measurement points and by averaging the measured values.

As regards defective exposure discrimination in relation to different layers, from a reticle-to-wafer synchronous error at the same position in shot and by using a discrimination criterion such as described above, the state of exposure at that position can be discriminated.

Next, another method for discrimination of defective exposure will be explained. When a semiconductor chip is exposed, a deviation in reticle-to-wafer distance causes a deviation in focal length of an optical system, which then leads to an exposure error. Such error in focal length influences sharpness of a pattern which is being formed with an exposure apparatus. The exposure error of a semiconductor chip can be detected in synchronism with pulse light emission timing and from the viewpoint of focus error. To this end, defective exposure may be discriminated while detecting an error Z influential to focal length, a rotational error $\omega_x$ about X axis, and a rotational error $\omega_y$ about Y axis, for example. For discrimination, there may be a method in which absolute values of errors in these directions Z, $\omega_x$ and $\omega_y$ are accumulated and in which whether the sum exceeds a preset threshold or not is checked, defective exposure being concluded if the threshold is exceeded. Also, there may be a method in which, for simplification of calculation, each of errors in these directions is compared with a corresponding error threshold determined beforehand and in which, if the threshold is exceeded, exposure of that portion is concluded as defective. Further, when a coordinate system on the wafer surface is such that the scan direction is denoted by X, the slit lengthwise direction is denoted by Y, rotational directions about these axes are denoted by $\omega_x$ and $\omega_y$, and a direction of normal to the plane containing X and Y axes is denoted by Z, if rotational errors $\omega_x$ and $\omega_y$ are applied to such wafer coordinate system, coordinate transformation such as equation (5) below may apply:

$$(x,y,z) \xrightarrow{A} (x',y',z') \quad (5)$$

where $$A = \begin{bmatrix} \cos\omega_y & 0 & -\sin\omega_y \\ 0 & 1 & 0 \\ \sin\omega_y & 0 & \cos\omega_y \end{bmatrix} \begin{bmatrix} 1 & 0 & 0 \\ 0 & \cos\omega_x & -\sin\omega_x \\ 0 & \sin\omega_x & \cos\omega_x \end{bmatrix}$$

If the wafer surface before the errors are applied is Z=0, the wafer surface after the rotational error and the Z-axis direction error $\Delta_z$ are applied is expressed by equation (6) below:

$$x \sin\omega_y + y \cos\omega_y \sin\omega_x + (z-\Delta_z) \cos\omega_y \cos\omega_x = 0 \quad (6)$$

Therefore, it is a possible method that the coordinate on the exposure area is substituted into equation (6), and that the distance (error) in focus direction is detected and a threshold is set to this error. Also, there may be a method in which errors at respective points in the exposure area are accumulated and a threshold is set to the total.

It is to be noted that errors $\Delta z$, $\omega_x$ and $\omega_y$ used here are optimum values each of which can be determined by, for example, using plural measurement points and by averaging the measured values.

When the validity of exposure in a semiconductor exposure apparatus using a pulse light source is to be discriminated, and particularly in a case where the requirement to tolerable exposure error is strict, it is practically not appropriate to use any of the error evaluation criteria described above, independently of the others. At least two of them may be used for discrimination. In that case, appropriate weighting may be made to respective criteria, for composite evaluation of the errors. Alternatively, errors based on respective discrimination criteria may be monitored and defective exposure may be concluded if defectiveness is found with reference to any of the discrimination criteria.

It is an alternative method that defective exposure is discriminated on the basis of a synchronous error between the masking blade and the stage system. In the scanning exposure, for shaping of the beam shape to be projected on to the reticle stage to regulate the beam irradiation region, the masking blade is moved in synchronism with the reticle stage movement. If however there is a synchronous error between the masking blade and the reticle stage, defective exposure results therefrom. Thus, the relative position of the masking blade and the reticle stage may be detected in the scanning exposure and, by using it, the state of exposure may be discriminated and whether exposure of that exposure area is defective or not may be discriminated. As regards relative positional factors, there may be directions of X, Y, Z, $\omega_X$, $\omega_Y$ and $\omega_Z$. As for discrimination method, like the defective exposure region discrimination method based on stage synchronous error, tolerable errors may be preset in relation to respective directions and synchronous error calculation may be made with regard to plural positions with in the region to be examined, and a largest error may be used for the discrimination. There may be another method in which a threshold may be set to the sum of measured errors, for defective exposure discrimination. It may be an alternative method that a threshold may be set to a result of statistical processing to errors at measuring points.

In accordance with any of such discrimination methods, the state of exposure is discriminated on the basis of an error, attributable to a synchronous error between the masking blade and the reticle stage. The portion as concluded as defective exposure may be memorized, and re-exposure may be performed to that portion.

Figure 21A:
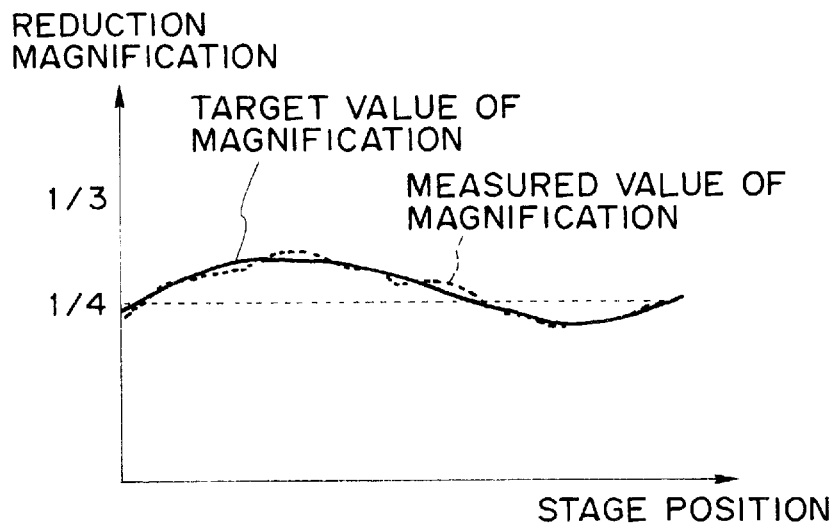
FIGS. 21A and 21B are graphs for explaining variation caused with changes in reduction magnification of a projection system, during scanning exposure.
Figure 21B:
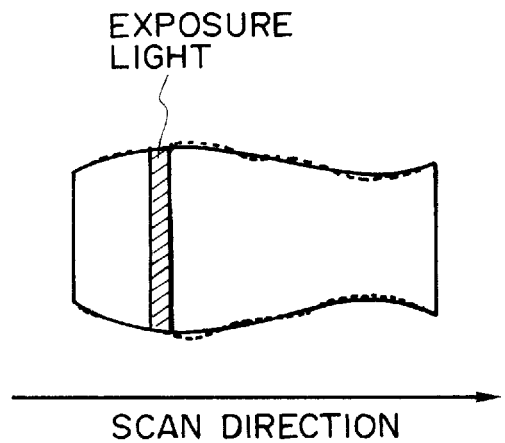

There are cases wherein in the scanning exposure a target reduction ratio of a projection optical system is set to the stage position. In that occasion, the reduction magnification of the projection optical system should be controlled with respect to the stage position, in real time. However, there is a possibility of an error between the target reduction ratio of the projection optical system and the actual reduction ratio thereof. FIG. 21 illustrates a case where the reduction magnification of a projection optical system varies during the scanning exposure. Specifically, portion (A) of FIG. 21 shows the reduction magnification of the projection optical system at the scan position. Curved broken line corresponds to a case where the target reduction magnification is constant. However, there is a possibility that at the scan position the reduction magnification changes as depicted by a solid line. In that occasion, the region to be printed on a wafer will be such as enclosed by a solid line in the portion (B) of FIG. 21. However, if the actual reduction magnification is such as depicted by the broken line in FIG. 21, (A), the region to be printed on the wafer will be such as enclosed by a broken line in FIG. 21, (B). If the shape of this broken line considerably differs from that of the solid line, image distortion results locally or wholly on the surface exposed. This influences overlaying of subsequent layers. It is therefore desirable to discriminate the state of exposure on the basis of an error between a target reduction magnification and actual reduction magnification, of a projection optical system at a scan position.

The concept of the present invention is applicable to such an error of a projection optical system. That is, an actual reduction magnification of a projection optical system corresponding to each pulse light exposure may be detected by using reduction magnification detecting means and, if the error of reduction magnification of the projection optical system with respect to a target reduction magnification is large, exposure may not be performed but re-exposure may be performed. For error discrimination, a threshold may be set with respect to a certain evaluation criterion and the state of exposure may be discriminated with reference to that threshold. As for the threshold setting, there may be a method in which a threshold is set to the amount of deviation itself from the target reduction magnification, and a method in which deviation from a target value may be measured at plural measurement points in the scan field and a threshold is set to a statistical value which is obtainable by statistically processing measured deviations. Further, there may be an alternative method based on a circuit pattern. That is, if, for example, a circuit pattern has a complicated structure as compared with other portions such that more strict precision is required to the reduction magnification, then, as an example, weighting may be made to measured values at plural measurement points and a threshold may be set to the deviation. It may be a further alternative to set a threshold to the result of statistical operation.

In accordance with any of such discrimination methods, defective exposure attributable to an error of reduction magnification of a projection optical system can be discriminated. The portion as concluded as defective exposure may be memorized, and re-exposure may be performed to that portion.

Figure 22:
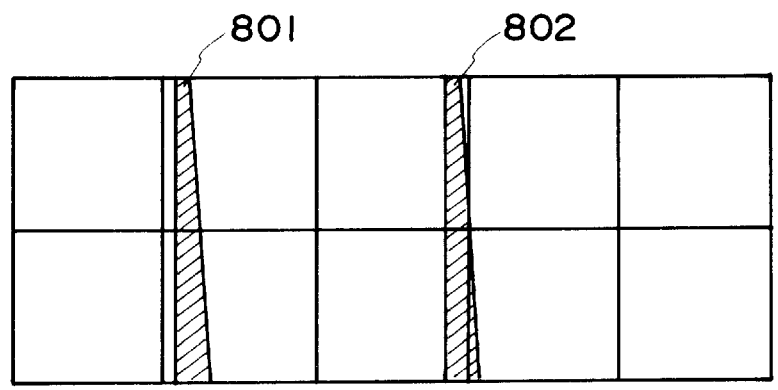
FIG. 22 is a schematic view, showing an example of display at a display device of the embodiment of FIG. 16.

The state of exposure on the wafer surface as well as unexposed position data may be displayed at a display device provided in the exposure apparatus, for operator's information. FIG. 22 illustrates an example of display. There are shown unexposed portions 801 and 802. After completion of exposure process to one shot and after checking that the stage positioning error does not influence to the exposure amount, re-exposure may be made to these unexposed portions by which the effect of positioning error can be canceled.

While the invention has been described with reference to the structures disclosed herein, it is not confined to the details set forth and this application is intended to cover such modifications or changes as may come within the purposes of the improvements or the scope of the following claims.

What is claimed is:

1. A scanning projection exposure apparatus comprising:
   an illumination optical system for illuminating an original with pulse light;
   a projection optical system for projecting a pattern of the original, illuminated with the pulse light from said illumination optical system, onto a substrate;
   moving means for moving the original and the substrate relative to each other;
   position measuring means for measuring a relative positional relation between the original and the substrate; and
   control means for discriminating whether the positional relation measured by said position measuring means is in a predetermined range, the discrimination being performed within a period after said moving means initiates the relative movement of the original and the substrate and before said illumination optical system initiates the projection exposure with the pulse light, said control means stopping the projection exposure with the pulse light from said illumination optical system when the positional relation is discriminated as being out of a predetermined range.

2. An apparatus according to claim 1, wherein said position measuring means comprises means for measuring the relative positional relation with respect to a movement direction and a direction perpendicular to the movement direction and means for measuring an interval between the substrate and the original.

3. An apparatus according to claim 1, wherein said control means causes said position measuring means, when the projection exposure with the pulse light is stopped, to again perform relative positional measurement, and to discriminate again whether the measured relative positional relation is within the predetermined range.

4. A scanning projection exposure apparatus, comprising:
   illumination means for illuminating an original with pulse light;
   a projection optical system for projecting a pattern of the original onto a substrate;
   moving means for relatively moving the original and the substrate;
   detecting means for detecting a state of exposure with an emission of the pulse light; and
   control means for causing said illumination means to illuminate the original with the pulse light while controlling said moving means to relatively move the original and the substrate, so that said projection optical system projects and prints the pattern of the original onto the substrate, said control means discriminating whether there is a non-good exposure region on the substrate, on the basis of the detection by said detecting means, and memorizing the position of a non-good exposure region.

5. An apparatus according to claim 4, wherein said detecting means produces a plurality of data and said control means performs the discrimination on the basis of at least two of the data.

6. An apparatus according to claim 4, wherein said detecting means comprises means for detecting a light quantity of pulse light.

7. An apparatus according to claim 4, wherein said detecting means comprises means for detecting the position of the original and the substrate in a timed relation with the emission of the pulse light.

8. An apparatus according to claim 4, wherein said control means performs the discrimination on the basis of a relative position of the original and a blade, which determines the illumination region on the original.

9. An apparatus according to claim 4, wherein said detecting means comprises means for detecting a projection magnification of said projection optical system with respect to each pulse light emission.

10. An apparatus according to claim 4, wherein said control means determines, on the basis of a past exposure state at a predetermined location upon the substrate, an integrated light quantity at the predetermined location to be provided by a subsequent pulse light emission, and discriminates whether non-good exposure is expected to be caused at the predetermined location, on the basis of the determination.

11. An apparatus according to claim 4, further comprising exposure amount controlling means for providing a constant exposure light intensity over the substrate, wherein said control means performs the discrimination on the basis of an exposure amount controlling precision of said exposure amount controlling means.

12. A scanning projection exposure apparatus, comprising:
   illumination means for illuminating an original with pulse light;
   a projection optical system for projecting a pattern of the original onto a substrate;
   moving means for relatively moving the original and the substrate;
   detecting means for detecting a state of exposure preceding an emission of the pulse light; and control means for causing said illumination means to illuminate the original with the pulse light while said moving means relatively moves the original and the substrate, so that said projection optical system projects and prints the pattern of the original onto the substrate, wherein said control means discriminates whether a non-good exposure region is to be produced on the substrate, on the basis of the detection by said detecting means, and memorizes a position of a region on the substrate with respect to which non-good exposure has been discriminated.

13. An apparatus according to claim 12, wherein said detecting means produces a plurality of data and said control means performs the discrimination on the basis of at least two of the data.

14. An apparatus according to claim 12, wherein said detecting means comprises means for detecting a light quantity of pulse light.

15. An apparatus according to claim 12, wherein said detecting means comprises means for detecting the position of the original and the substrate in a timed relation with the emission of the pulse light.

16. An apparatus according to claim 12, wherein said control means performs the discrimination on the basis of a relative position of the original and a blade, which determines the illumination region on the original.

17. An apparatus according to claim 12, wherein said detecting means comprises means for detecting a projection magnification of said projection optical system with respect to each pulse light emission.

18. An apparatus according to claim 12, wherein said control means determines, on the basis of a past exposure state at a predetermined location upon the substrate, an integrated light quantity at the predetermined location, to be provided by a subsequent pulse light emission, and discriminates whether non-good exposure is to be caused at the predetermined location, on the basis of the determination.

19. An apparatus according to claim 12, further comprising exposure amount controlling means for providing a constant exposure light intensity over the substrate, wherein said control means performs the discrimination on the basis of an exposure amount controlling precision of said exposure amount controlling means.

20. A scanning projection exposure method, comprising the steps of:
    illuminating an original with pulse light while moving the original and a substrate relative to each other, so that a pattern of the original is projected onto the substrate through a projection optical system;
    measuring a relative positional relation between the original and the substrate by position measuring means;
    discriminating whether the measured positional relation is within a predetermined range, within a period after the relative motion of the original and the substrate is initiated and before the projection exposure of the substrate is initiated; and
    stopping the projection exposure with the pulse light when the positional relation is discriminated as being out of the predetermined range.

21. A method according to claim 20, wherein said measuring step comprises measuring the positional relation with respect to a movement direction and a direction perpendicular to the movement direction, and measuring an interval between the substrate and the original.

22. A method according to claim 20, further comprising measuring again the positional relation between the original and the substrate, when the projection exposure with the pulse light is stopped, and discriminating again whether the measured positional relation is within the predetermined range.

23. A scanning projection exposure method, comprising the steps of:
    illuminating an original with pulse light while relatively moving the original and a substrate so that a pattern of the original is projected onto the substrate;
    detecting a state of exposure with an emission of the pulse light;
    discriminating, on the basis of the detection, whether there is a non-good exposure region on the substrate; and
    memorizing the position of a non-good exposure region.

24. A method according to claim 23, wherein said detecting step comprises producing a plurality of data and said discriminating step comprises performing the discrimination on the basis of at least two of the data.

25. A method according to claim 23, wherein said detecting step comprises detecting a light quantity of the pulse light.

26. A method according to claim 23, wherein said detecting step comprises detecting the position of the original and the substrate in a timed relation with the emission of the pulse light.

27. A method according to claim 23, wherein said discriminating step is performed on the basis of a relative position of the original and a blade, which determines the illumination region on the original.

28. A method according to claim 23, wherein said detecting step comprises detecting a projection magnification of a projection optical system with respect to each pulse light emission.

29. A method according to claim 23, further comprising determining, on the basis of a past exposure state at a predetermined location upon the substrate, an integrated light quantity at the predetermined location, to be provided by a subsequent pulse light emission, and discriminating whether non-good exposure is to be caused at the predetermined location, on the basis of the determination.

30. A method according to claim 23, further comprising controlling an exposure amount to provide a constant exposure light intensity over the substrate, wherein said discriminating step is performed on the basis of an exposure amount controlling precision in said exposure amount controlling step.

31. A scanning projection exposure method, comprising the steps of:
    illuminating an original with pulse light while relatively moving the original and a substrate so that a pattern of the original is projected onto the substrate;
    detecting a state of exposure preceding the emission of the pulse light;
    discriminating, on the basis of the detection, whether a non-good exposure region is to be produced on the substrate; and
    memorizing the position of a region with respect to which the non-good exposure has been discriminated.

32. A method according to claim 31, wherein said detecting step comprises producing a plurality of data and said discriminating step comprises performing the discrimination on the basis of at least two of the data.

33. A method according to claim 32, wherein said detecting step comprises detecting a light quantity of the pulse light.

34. A method according to claim 32, wherein said detecting step comprises detecting the position of the original and the substrate in a timed relation with the emission of the pulse light.

35. A method according to claim 32, wherein said discriminating step is performed on the basis of a relative position of the original and a blade, which determines the illumination region on the original.

36. A method according to claim 32, wherein said detecting step comprises detecting a projection magnification of a projection optical system with respect to each pulse light emission.

37. A method according to claim 32, further comprising determining, on the basis of a past exposure state at a predetermined location upon the substrate, an integrated light quantity at the predetermined location, to be provided by a subsequent pulse light emission, and discriminating whether non-good exposure is to be caused at the predetermined location, on the basis of the determination.

38. A method according to claim 32, further comprising controlling an exposure amount to provide a constant exposure light intensity over the substrate, wherein said discriminating step is performed on the basis of an exposure amount controlling precision in said exposure amount controlling step.

39. A scanning projection exposure apparatus, comprising:
 illumination means for illuminating an original with pulse light;
 a projection optical system for projecting a pattern of the original onto a substrate;
 moving means for relatively moving the original and the substrate;
 detecting means for detecting a state of exposure with an emission of the pulse light, said detecting means producing a plurality of data; and
 control means for causing said illumination means to illuminate the original with the pulse light while controlling said moving means to relatively move the original and the substrate, so that said projection optical system projects and prints the pattern of the original onto the substrate, said control means discriminating whether there is a non-good exposure region on the substrate, on the basis of the detection by said detecting means, and performing the discrimination on the basis of at least two of the data produced by said detecting means.

40. An apparatus according to claim 39, wherein said control means memorizes the position of a non-good exposure region.

41. An apparatus according to claim 39, wherein said detecting means comprises means for detecting a light quantity of pulse light.

42. An apparatus according to claim 39, wherein said detecting means comprises means for detecting the position of the original and the substrate in a timed relation with the emission of the pulse light.

43. An apparatus according to claim 39, wherein said control means performs the discrimination on the basis of a relative position of the original and a blade, which determines the illumination region on the original.

44. An apparatus according to claim 39, wherein said detecting means comprises means for detecting a projection magnification of said projection optical system with respect to each pulse light emission.

45. An apparatus according to claim 39, wherein said control means determines, on the basis of a past exposure state at a predetermined location upon the substrate, an integrated light quantity at the predetermined location to be provided by a subsequent pulse light emission, and discriminates whether non-good exposure is expected to be caused at the predetermined location, on the basis of the determination.

46. An apparatus according to claim 39, further comprising exposure amount controlling means for providing a constant exposure light intensity over the substrate, wherein said control means performs the discrimination on the basis of an exposure amount controlling precision of said exposure amount controlling means.

47. A scanning projection exposure apparatus, comprising:
 illumination means for illuminating an original with pulse light;
 a projection optical system for projecting a pattern of the original onto a substrate;
 moving means for relatively moving the original and the substrate;
 detecting means for detecting a state of exposure preceding an emission of the pulse light, said detecting means producing a plurality of data; and
 control means for causing said illumination means to illuminate the original with the pulse light while said moving means relatively moves the original and the substrate, so that said projection optical system projects and prints the pattern of the original on the substrate, wherein said control means discriminates whether a non-good exposure region is to be produced on the substrate, on the basis of the detection by said detecting means, and performs the discrimination on the basis of at least two of the data.

48. An apparatus according to claim 47, wherein said control means memorizes the position of a region on the substrate with respect to which non-good exposure has been discriminated.

49. An apparatus according to claim 47, wherein said detecting means comprises means for detecting a light quantity of pulse light.

50. An apparatus according to claim 47, wherein said detecting means comprises means for detecting the position of the original and the substrate in a timed relation with the emission of the pulse light.

51. An apparatus according to claim 47, wherein said control means performs the discrimination on the basis of a relative position of the original and a blade, which determines the illumination region on the original.

52. An apparatus according to claim 47, wherein said detecting means comprises means for detecting a projection magnification of said projection optical system with respect to each pulse light emission.

53. An apparatus according to claim 47, wherein said control means determines, on the basis of a past exposure state at a predetermined location upon the substrate, an integrated light quantity at the predetermined location, to be provided by a subsequent pulse light emission, and discriminates whether non-good exposure is to be caused at the predetermined location, on the basis of the determination.

54. An apparatus according to claim 47, further comprising exposure amount controlling means for providing a constant exposure light intensity over the substrate, wherein said control means performs the discrimination on the basis of an exposure amount controlling precision of said exposure amount controlling means.

55. A scanning projection exposure method, comprising the steps of:
 illuminating an original with pulse light while relatively moving the original and a substrate so that a pattern of the original is projected onto the substrate;

detecting a state of exposure with an emission of the pulse light and producing a plurality of data; and discriminating, on the basis of the detection, whether there is a non-good exposure region on the substrate, said discriminating step comprising performing the discrimination on the basis of at least two of the data produced in said detecting step.

56. A method according to claim 55, further comprising memorizing the position of a non-good exposure region.

57. A method according to claim 55, wherein said detecting step comprises detecting a light quantity of the pulse light.

58. A method according to claim 55, wherein said detecting step comprises detecting the position of the original and the substrate in a timed relation with the emission of the pulse light.

59. A method according to claim 55, wherein said discriminating step is performed on the basis of a relative position of the original and a blade, which determines the illumination region on the original.

60. A method according to claim 55, wherein said detecting step comprises detecting a projection magnification of a projection optical system with respect to each pulse light emission.

61. A method according to claim 55, further comprising determining, on the basis of a past exposure state at a predetermined location upon the substrate, an integrated light quantity at the predetermined location, to be provided by a subsequent pulse light emission, and discriminating whether non-good exposure is to be caused at the predetermined location, on the basis of the determination.

62. A method according to claim 55, further comprising controlling an exposure amount to provide a constant exposure light intensity over the substrate, wherein said discriminating step is performed on the basis of an exposure amount controlling precision in said exposure amount controlling step.

63. A scanning projection exposure method, comprising the steps of:

illuminating an original with pulse light while relatively moving the original and a substrate so that a pattern of the original is projected onto the substrate;

detecting a state of exposure preceding the emission of the pulse light and producing a plurality of data; and discriminating, on the basis of the detection, whether a non-good exposure region is to be produced on the substrate, said discriminating step comprising performing the discrimination on the basis of at least two of the data produced in said detecting step.

64. A method according to claim 63, further comprising memorizing the position of a region with respect to which the non-good exposure has been discriminated.

65. A method according to claim 63, wherein said detecting step comprises detecting a light quantity of the pulse light.

66. A method according to claim 63, wherein said detecting step comprises detecting the position of the original and the substrate in a timed relation with an emission of the pulse light.

67. A method according to claim 63, wherein said discriminating step is performed on the basis of a relative position of the original and a blade, which determines the illumination region on the original.

68. A method according to claim 63, wherein said detecting step comprises detecting a projection magnification of a projection optical system with respect to each pulse light emission.

69. A method according to claim 63, further comprising determining, on the basis of a past exposure state at a predetermined location upon the substrate, an integrated light quantity at the predetermined location, to be provided by a subsequent pulse light emission, and discriminating whether non-good exposure is to be caused at the predetermined location, on the basis of the determination.

70. A method according to claim 63, further comprising controlling an exposure amount to provide a constant exposure light intensity over the substrate, wherein said discriminating step is performed on the basis of an exposure amount controlling precision in said exposure amount controlling step.

\* \* \* \* \*

UNITED STATES PATENT AND TRADEMARK OFFICE
CERTIFICATE OF CORRECTION

PATENT NO.   : 5,883,701
DATED        : March 16, 1999
INVENTOR(S)  : Noriyasu Hasegawa et al.

It is certified that error appears in the above-identified patent and that said Letters Patent is hereby corrected as shown below:

Column 1,
Line 8, "in" should read -- in the --;
Line 15, "FIG. 1, (a) and (b)," should read -- FIGS. 1(a) and (b), --;
Line 18, "FIG. 2" should read -- FIGS. 2(a) through 2(c), --;
Line 22, "at the first," should read -- initially, --;
Line 25, "wafer" should read -- the wafer --;
Line 27, "correction" should read -- a correction --;
Line 29, "largest" should read -- the largest --;
Line 30, "start" should read -- a start --;
Line 31, "as a second," should read -- next --;
Line 35, "use" should read -- the use --;
Line 45, "exposure" should read -- the exposure --;
Line 49, "and it needs" should read -- which requires --;
Line 51, "chips, thus" should read -- chips --; and
Line 64, "on to" should read -- onto --.

Column 2,
Line 1, "illuminating" should read -- illumination of --;
Line 5, "is" should be deleted;
Line 6, "also serviceable to (i)" should read -- controls operation (i) to --;
Line 7, "use" should read -- the use --;
Lines 8 and 11, "pulse" should read -- the pulse --;
Line 17, "on to" should read -- onto --;
Line 20, "emission" should read -- the emission --;
Lines 21 and 37, "illuminating" should read -- illumination of -- and "pulse" should read -- the pulse --;
Line 25, "system;" should read -- system, -- and "is" should read -- also controls operation --;
Line 26, "also serviceable" should be deleted;
Line 33, "on to" should read -- onto --;
Line 36, "to" should be deleted and "pulse" should read -- the pulse --;
Line 41, "is" should be deleted;
Line 42, "serviceable" should read -- controls operation --;
Line 45; "a yet" should read -- yet a --;
Line 50, "on to" should read -- onto --;
Line 54, "pulse" should read -- the pulse --; and
Line 62, "emission" should read -- the emission --.

UNITED STATES PATENT AND TRADEMARK OFFICE
CERTIFICATE OF CORRECTION

PATENT NO. : 5,883,701
DATED : March 16, 1999
INVENTOR(S) : Noriyasu Hasegawa et al.

Figure 1A:
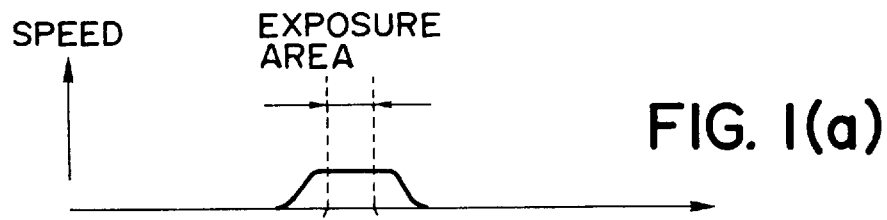
FIG. 1 is a graph for explaining speed profiles of a wafer stage and a reticle stage of a scanning exposure apparatus.
Figure 1B:
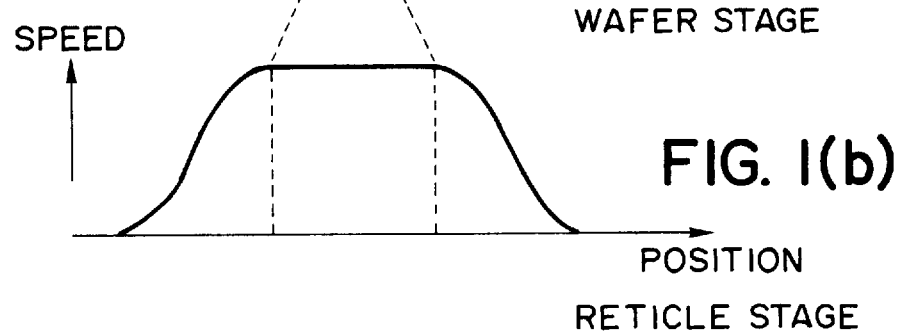
Figure 2A:
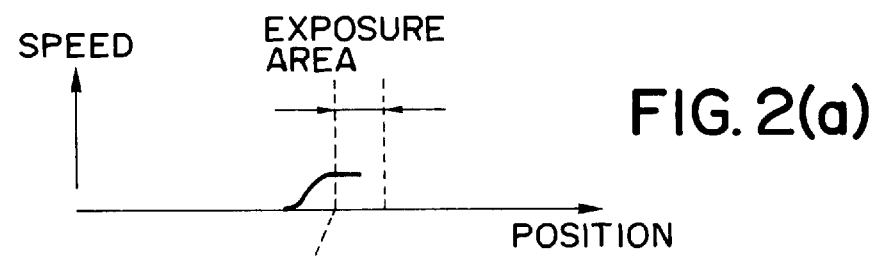
FIG. 2 is a graph for explaining an exposure area and a deviation of a wafer stage and a reticle stage.
Figure 2B:
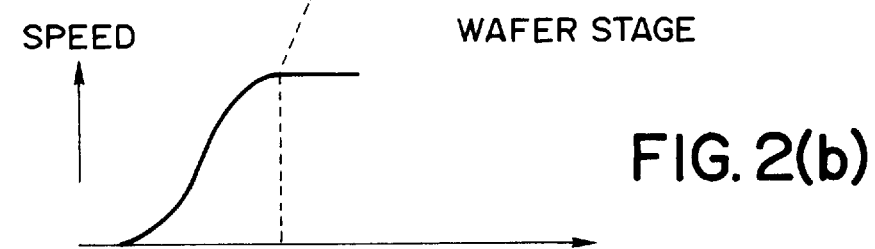
Figure 2C:
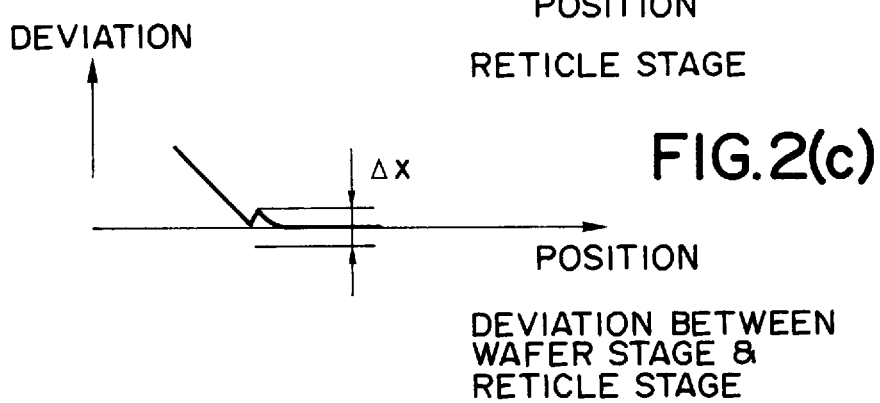

It is certified that error appears in the above-identified patent and that said Letters Patent is hereby corrected as shown below:

Column 3,
Line 4, "to" should be deleted;
Line 5, "pulse" should read -- the pulse --;
Line 15, "FIG. 1 is a graph" should read -- FIGS. 1(a) and 1(b) are graphs --;
Line 17, "FIG. 2 is a graph" should read -- FIGS. 2(a) through 2(c) are graphs --;
Line 26, "pulse" should read --a pulse--;
Line 39, "FIG. 11 is a schematic view" should read -- FIGS. 11(a) through 11(c) are schematic views --;
Line 45, "variation" should read -- a variation --;
Line 49, "completion" should read -- the completion -- and "dicing" should read -- a dicing --; and
Line 52, "display" should read -- a display --; and
Line 65, "variation" should read -- a variation --.

Column 4,
Line 2, "display" should read -- a display --;
Line 11, "manufacture" should read -- the manufacture --;
Line 30, "perpendicularly" should read -- perpendicular --;
Line 32, "on to" should read -- onto --;
Line 59, "trigger" should read -- a trigger --;
Line 60, "monitored" should read -- monitor --; and
Line 64, "Desired" should read -- A desired --.

Column 5,
Line 1, "exposure" should read -- an exposure --;
Line 3, "wafer-" should read -- a wafer- --;
Line 4, "scan" should read -- the scan --;
Line 5, "positional" should read -- a positional -- and "non-scan" should read -- a non-scan --;
Line 6, "deviation in" should read -- a deviation in the --;
Line 7, " $(E_{13}$ TIMES)" should read -- (E_TIMES) -- and "in" should be deleted;
Line 8, "a case" should read -- when --;
Line 17, "laser" should read -- a laser --;
Line 18, "stable" should read -- a stable --;
Line 20, "drive" should read -- the drive --;
Line 26, "scan" should read -- the scan --;
Line 27, "non-scan" should read -- the non-scan --;
Line 28, "start" should read -- a start --;
Line 32, "sequence" should read -- the sequence --;
Line 36, "positional" should read -- a positional --;
Lines 45 and 48, "$E_{13}$ TIMES" should read -- E_TIMES --; and
Line 51, "discrimination" should read -- a discrimination --.

UNITED STATES PATENT AND TRADEMARK OFFICE
CERTIFICATE OF CORRECTION

PATENT NO. : 5,883,701
DATED : March 16, 1999
INVENTOR(S) : Noriyasu Hasegawa et al.

It is certified that error appears in the above-identified patent and that said Letters Patent is hereby corrected as shown below:

Column 6,
Line 4, "specific" should read -- a specific --;
Lines 7, 25 and 28, "defective" should read -- a defective --;
Line 12, "operation" should read -- an operation -- and "more" should read -- longer --;
Line 19, "where" should read -- wherein --;
Line 35, "manufacture" should read -- the manufacture --;
Line 57, "on to" should read -- onto --; and
Line 66, "Control" should read -- A control --.

Column 7,
Line 2, "theses" should read -- these --;
Line 7, "laser" should read -- the laser --;
Line 8, "start" should read -- a start --;
Line 9, "actual" should read -- an actual --;
Line 10, "detected" should read -- detection --;
Line 12, "takes" should read -- takes a --;
Line 15, "actual" should read -- an actual --;
Line 25, "Focus" should read -- A focus --, "is" should read -- is, -- and "hand" should read -- hand, --;
Line 30, "operates" should read -- operate --;
Line 32, "produces" should read -- produce --;
Line 40, "control" should read -- a control --;
Line 43, "computation," should read -- the computation, --;
Line 51, "such" should read -- such a --;
Line 53, "scan" should read -- a scan -- and "scanning" should read -- a scanning --;
Line 56, "variation" should read -- a variation --;
Line 61, "failure" should read -- a failure --; and
Line 65, "occurred" should read -- occurring --.

UNITED STATES PATENT AND TRADEMARK OFFICE
CERTIFICATE OF CORRECTION

PATENT NO.    : 5,883,701
DATED         : March 16, 1999
INVENTOR(S)   : Noriyasu Hasegawa et al.

It is certified that error appears in the above-identified patent and that said Letters Patent is hereby corrected as shown below:

Column 8,
Line 4, "construction" should read -- a construction --;
Line 8, "defective" should read -- a defective --;
Line 9, "defective" should read -- the defective --;
Line 10, "defective" should read -- a defective -- and "inspecting" should read -- an inspecting --;
Line 14, "exposure" should read -- an exposure --;
Line 15, "pulse" should read -- a pulse --;
Line 16, "error" should read -- error, --;
Line 18, "direction" should read -- direction, --;
Line 19, "about" should read -- about the --;
Line 20, "about" (both occurrences) should read -- about the --;
Line 22, "semiconductor" should read -- the semiconductor -- and "dis-" should read -- a dis- --;
Line 23, "defective" should read -- a defective --;
Line 28, "reduced" should read -- a reduced --;
Line 31, "defective." should read -- being defective. --;
Line 32, "X-axis" should read -- the X-axis --;
Line 33, "Y-axis" should read -- the Y-axis --;
Line 34, "Z-axis" should read -- the Z-axis --;
Line 35, "exposure" should read -- the exposure --;
Line 38, "Z axis" should read -- the Z-axis --;
Line 39, "coordinate" should read -- a coordinate --;
Line 46, "distance" should read -- a distance --;
Line 48, "accumulation" should read -- the accumulation -- and "discrimi-" should read -- a discrimi- --;
Line 49, "defective" should read -- a defective --;
Line 53, "distance" should read -- a distance -- and "for" should read -- for a --;
Line 54, "defective" should read -- a defective --;
Line 56, "defective" (first occurrence) should read -- being defective, --;
Line 60, "further" should read -- a further --;
Line 62, "values" should read -- values, --;
Line 65, "defective" should read -- a defective --; and
Line 67, "shot" should read -- a shot --.

UNITED STATES PATENT AND TRADEMARK OFFICE
CERTIFICATE OF CORRECTION

PATENT NO. : 5,883,701
DATED : March 16, 1999
INVENTOR(S) : Noriyasu Hasegawa et al.

It is certified that error appears in the above-identified patent and that said Letters Patent is hereby corrected as shown below:

Column 9,
Line 3, "discrimination of defective" should read -- a discrimination of a defective --;
Line 7, "error" should read -- an error --;
Line 11, "defective" should read -- a defective --;
Line 12, "error z" should read -- error Z --;
Line 13, "local" should read -- focal -- and "X axis," should read -- X-axis, --;
Line 14, "Y axis." should read -- the Y-axis. --;
Line 17, "defective" should read -- with defective --;
Line 20, "calculation," should read -- the calculation, -- and "errors" should read -- the errors --;
Line 23, "defective." should read -- being defective. --;
Line 27, "normal" should read -- a normal -- and "X" should read -- the X --;
Line 29, "wafer" should read -- a wafer -- and "coordinate" (second occurrence) should read -- a coordinate --;
Line 58, "discrimination of defective" should read -- a discrimination of a defective --;
Line 62, "uniform" should read -- a uniform -- and "FIG. 11" should read -- FIGS. 11(a) through 11(c) --;
Line 63, "illustrates" should read -- illustrate -- and "exposure" should read -- an exposure --;
Line 64, "water," should read -- wafer, --;
Line 66, "slit-like" should read -- a slit-like --; and
Line 67, "lateral" should read -- the lateral --.

UNITED STATES PATENT AND TRADEMARK OFFICE
CERTIFICATE OF CORRECTION

PATENT NO. : 5,883,701
DATED : March 16, 1999
INVENTOR(S) : Noriyasu Hasegawa et al.

It is certified that error appears in the above-identified patent and that said Letters Patent is hereby corrected as shown below:

Column 10,
Line 2, "in" should read -- in the --;
Line 3, "the portion (a) of FIG." should read -- FIG. 11(a), --;
Line 4, "11" should be deleted;
Line 6, "uniform" should read -- a uniform --;
Line 7, "Portions (b) and (c) of FIG. 11" should read -- FIGS. 11 (b) and 11 (c) --;
Line 8, "The portion (b) of FIG. 11" should read -- FIG. 11 (b) --;
Line 9, "where" should read -- wherein -- and "the" (second occurrence) should be deleted;
Line 10, "portion (c) of FIG. 11" should read -- FIG. 11 (c) -- and "where" should read -- wherein --;
Line 13, "variation in exposure" should read -- a variation in an exposure --;
Line 17, "such" (both occurrences) should read -- such a --;
Line 18, "scan" should read -- a scan --;
Line 27, "exposure" should read -- an exposure --;
Line 28, "variation" should read -- a variation --;
Line 29, "exposure" should read -- an exposure --;
Line 31, "sequence of" should read -- the sequence of a --;
Line 32, "conducted" should read -- conducted, --;
Line 36, "such" should read -- such an --;
Line 38, "where" should read -- wherein --;
Line 40, "can not" should read -- cannot --;
Line 41, "where," should read -- wherein, --;
Line 43, "can not" should read -- cannot --;
Line 45, "portion" should read -- a portion -- and "defective" should read -- a defective --;
Line 46, "defective" should read -- the defective --;
Line 48, "chip" should read -- a chip --;
Line 49, "exposure" should read -- an exposure --;
Line 50, "defective" should read -- a defective --;
Line 54, "$\omega_Z$." should read -- $\omega_z$ positions. --;
Line 57, "discrimination" should read -- a discrimination --;
Line 61, "calculation" should read -- the calculation --;
Line 63, "variation," should read -- a variation, --; and
Line 64, "variation" should read -- the variation -- and "dis-" should read -- a dis- --.

UNITED STATES PATENT AND TRADEMARK OFFICE
CERTIFICATE OF CORRECTION

PATENT NO.    : 5,883,701
DATED         : March 16, 1999
INVENTOR(S)   : Noriyasu Hasegawa et al.

It is certified that error appears in the above-identified patent and that said Letters Patent is hereby corrected as shown below:

Column 11,
Line 3, "can not" should read -- cannot --;
Line 4, "can not" should read -- cannot --;
Line 19, "composite" should read -- a composite- -;
Line 20, "defective" should read -- a defective --;
Line 21, "defective" should read -- a defective --;
Line 24, "on" should read -- onto --;
Line 25, "to" (first occurrence) should be deleted;
Line 27, "If however" should read -- If, however, --;
Line 29, "defective" should read -- a defective --;
Line 35, "for" should read -- for a --;
Line 39, "and" should read -- and a --;
Line 40, "with in" should read -- within --;
Line 43, "defective" should read -- a defective --;
Line 46, "to" should read -- of --;
Line 47, "such" should read -- these --;
Line 50, "as" (first occurrence) should be deleted and "as" (second occurrence) should read -- as being --;
Line 52, "portion" should read -- a portion --;
Line 53, "portion" should read -- a portion --;
Line 55, "wherein" should read -- wherein, -- and "exposure" should read -- exposure, --;
Line 57, "In" should read -- On --;
Line 62, "where" should read -- wherein --;
Line 64, "portion (A) of FIG. 13" should read -- FIG. 13A --;
Line 66, "Curved" should read -- A curved --; and
Line 67, "where" should read -- wherein --.

UNITED STATES PATENT AND TRADEMARK OFFICE
CERTIFICATE OF CORRECTION

PATENT NO. : 5,883,701
DATED : March 16, 1999
INVENTOR(S) : Noriyasu Hasegawa et al.

It is certified that error appears in the above-identified patent and that said Letters Patent is hereby corrected as shown below:

Column 12:
Line 3, "In" should read -- On --;
Line 4, "the portion (B) of FIG." should read -- FIG. 13B. --;
Line 5, "13." should be deleted;
Line 6, "FIG. 13, (A)," should read -- FIG. 13A, --;
Line 8, "FIG. 13, (B)." should read -- FIG. 13B. --;
Line 11, "is" should read -- is, --;
Line 12, "fore" should read -- fore, --;
Line 14, "actual" should read -- an actual --;
Line 23, "performed" should read -- performed, --;
Line 41, "statistical" should read -- a statistical --;
Line 43, "defectives" should read -- a defective -- and "reduction" should read
-- a reduction --;
Line 45, "as" (first occurrence) should be deleted and "as" (second occurrence) should
read -- as being a --;
Line 47, "portion" should read -- a portion --;
Line 48, "portion" should read -- a portion --;
Line 55, "such" should read -- such a --;
Line 59, "discrimination" should read -- a discrimination --; and
Line 65, "dicing" should read -- a dicing --.

Column 13,
Line 3, "operator's" should read -- the operator's --;
Line 4, "display," should read -- a display, --;
Line 10, "for" should read -- for the --;
Line 33, "on to" should read -- onto --;
Line 42, "Control" should read -- A control --;
Line 44, "101" should read -- 101, --;
Line 45, "theses" should read -- these --;
Line 48, "emission" should read -- an emission --;
Line 52, "start of" should read -- a start of an --;
Line 54, "detected" should read -- detection --;
Line 56, "takes" should read -- takes a --; and
Line 59, "actual" should read -- an actual --.

UNITED STATES PATENT AND TRADEMARK OFFICE
CERTIFICATE OF CORRECTION

PATENT NO. : 5,883,701
DATED : March 16, 1999
INVENTOR(S) : Noriyasu Hasegawa et al.

It is certified that error appears in the above-identified patent and that said Letters Patent is hereby corrected as shown below:

Column 14,
Line 2, "Focus" should read -- A focus --, "is" should read -- is, -- and "hand" should read -- hand, --;
Line 6, "operates" should read -- operate --;
Line 8, "produces" should read -- produce --;
Line 16, "control" should read -- a control --;
Line 18, "of" (second occurrence) should read -- of the --;
Line 24, "pulse" should read -- the pulse -- and "before" should read -- before the --;
Line 25, "pulse" should read -- the pulse --;
Line 28, "discrimination" should read -- a discrimination --;
Line 29, "detected" should read -- the detected --;
Line 32, "error can not" should read -- the error cannot --;
Line 33, "emission" should read -- the emission --;
Line 35, "period" should read -- a period --;
Line 36, "unexposed" should read -- an unexposed --;
Line 39, "exposure" should read -- an exposure --;
Line 40, "defective" should read -- a defective --;
Line 43, "stage, is" should read -- stage are --;
Line 45, "discrimination" should read -- a discrimination --;
Line 50, "subsequent" should read -- a subsequent --;
Line 61, "stage" should read -- the stage --;
Line 64, "In" should read -- On --;
Line 65, "not" should read -- or not --; and
Line 67, "exposure" should read -- the exposure --.

Column 15,
Lines 13, 40 and 41, "defective" should read -- a defective --;
Line 22, "timing" should read -- a timing --;
Line 26, "exposure" should read -- the exposure --;
Line 29, "defective" should read -- a defective --;
Line 35, "timing" should read -- a timing --;
Line 36, "exposure" should read -- the exposure --;
Line 44, "such" should read -- such a --;
Line 46, "scan" should read -- a scan -- and "scanning" should read -- a scanning --;
Line 47, "scanning" should read -- a scanning --;
Line 49, "variation in" should read -- a variation in the --;
Line 54, "failure" should read -- the failure --;
Line 58, "occurred" should read -- occurring --;
Line 64, "construction" should read -- the construction --; and
Line 66, "formation" should read -- the formation --.

UNITED STATES PATENT AND TRADEMARK OFFICE
CERTIFICATE OF CORRECTION

PATENT NO. : 5,883,701
DATED : March 16, 1999
INVENTOR(S) : Noriyasu Hasegawa et al.

It is certified that error appears in the above-identified patent and that said Letters Patent is hereby corrected as shown below:

Column 16,
Line 1, "pulse" should read -- the pulse --;
Line 2, "emission of pulse" should read -- the emission of the pulse -- and "defective" should read -- a defective --;
Line 7, "defective" should read -- a defective -- and "synchronous" should read -- a synchronous --;
Line 9, "calculation of" should read -- a calculation of an --;
Line 10, "direction of" should read -- detection of a --;
Line 11, "error" should read -- error, --;
Line 13, "Z axis." should read -- the Z-axis. --;
Line 14, "semiconductor" should read -- the semiconductor -- and "For" should read -- For a --;
Line 15, "defective" should read -- a defective --;
Line 18, "are" should read -- and --;
Line 21, "as" should read -- as being -- and "reduced" should read -- a reduced --;
Line 24, "as" should read -- as being --;
Line 25, "X-axis" should read -- the X-axis --;
Line 26, "Y-axis" should read -- the Y-axis --;
Line 27, "z-axis" should read -- the Z-axis --;
Line 28, "exposure" should read -- the exposure --;
Line 29, "where" should read -- wherein --;
Line 31, "Z axis," should read -- the Z-axis, --;
Line 32, "coordinate" should read -- a coordinate --;
Line 39, "such" should read -- such a --;
Line 41, "accumulation" should read -- the accumulation -- and "discrimi-" should read -- a discrimi- --;
Line 42, "defective" should read -- a defective --;
Line 45, "defective" should read -- a defective --;
Line 46, "accumulation" should read -- the accumulation --;
Line 47, "discrimination of" should read -- a discrimination of a --;
Line 49, "as defective" should read -- as being defective, --;
Line 53, "further" should read -- a further --;
Line 58, "defective" should read -- a defective --;
Line 63, "discrimination of" should read -- a discrimination of a --; and
Line 67, "error" should read -- an error --.

UNITED STATES PATENT AND TRADEMARK OFFICE
CERTIFICATE OF CORRECTION

PATENT NO. : 5,883,701
DATED : March 16, 1999
INVENTOR(S) : Noriyasu Hasegawa et al.

It is certified that error appears in the above-identified patent and that said Letters Patent is hereby corrected as shown below:

Column 17,
Lines 5, 62 and 65, "defective" should read -- a defective --;
Line 7, "X axis," should read -- the X-axis, -- and "Y axis," should read -- the Y-axis, --;
Line 14, "errors" should read -- the errors --;
Line 17, "as" should read -- as being --;
Line 21, "normal" should read -- a normal -- and "X" should read -- the X --;
Line 23, "wafer" should read -- a wafer-- and "coordinate" should read -- a coordinate --;
Line 54, "where" should read -- wherein --;
Line 55, "to" should read -- for --; and
Line 60, "composite" should read -- a composite --.

Column 18,
Line 1, "shape" should be deleted and "on" should read -- onto --;
Line 2, "to" (first occurrence) should be deleted;
Line 4, "If however" should read -- If, however, --;
Line 5, "defective" should read -- a defective --;
Line 11, "discrimination" should read -- a discrimination --;
Line 15, "with in" should read -- within --;
Line 19, "defective" should read -- a defective --;
Line 22, "such" should read -- these --;
Line 23, "error," should read -- error --;
Line 25, "as" (first occurrence) should be deleted and "as" (second occurrence) should read -- as being a --;
Line 30, "In" should read -- On --;
Line 35, "where" should read -- wherein --;
Line 37, "portion (A) of FIG. 21" should read -- FIG. 21A --;
Line 39, "Curved" should read -- A curved --;
Line 40, "where" should read -- wherein --;
Line 41, "that" should read -- that, -- and "position" should read -- position, --;
Line 43, "In" should read -- On --;
Line 44, "the portion (B) of FIG." should read -- FIG. 21B. --;
Line 45, "21." should be deleted;
Line 46, "FIG. 21, (A)," should read -- FIG. 21A, --;
Line 48, "FIG. 21, (B)." should read -- FIG. 21B. --;
Line 51, "is" should read - -is, --;
Line 52, "fore" should read -- fore, --;
Line 54, "actual" should read -- an actual --;
Line 61, "reduction" should read -- the reduction --; and
Line 63, "performed" should read -- performed, --.

UNITED STATES PATENT AND TRADEMARK OFFICE
CERTIFICATE OF CORRECTION

PATENT NO.   : 5,883,701
DATED        : March 16, 1999
INVENTOR(S)  : Noriyasu Hasegawa et al.

It is certified that error appears in the above-identified patent and that said Letters Patent is hereby corrected as shown below:

Column 19,
Line 3, "deviation" should read -- a deviation --;
Line 14, "statistical" should read -- a statistical --;
Line 18, "as" (first occurrence) should be deleted and "as" (second occurrence) should read -- as being a --;
Line 23, "operator's" should read -- the operator's --;
Line 24, "display." should read -- a display. --;
Line 25, "comple-" should read -- the comple- --;
Line 26, "exposure" should read -- an exposure --;
Line 27, "to" should be deleted; and
Line 29, "positioning" should read -- the positioning --.

Signed and Sealed this

Fifteenth Day of October, 2002

Attest:

JAMES E. ROGAN
*Attesting Officer*   *Director of the United States Patent and Trademark Office*